(12) United States Patent
Takiguchi et al.

(10) Patent No.: US 8,262,300 B2
(45) Date of Patent: *Sep. 11, 2012

(54) COATING AND DEVELOPING APPARATUS, DEVELOPING METHOD AND NON-TRANSITORY MEDIUM

(75) Inventors: Yasushi Takiguchi, Kumamoto (JP);
Taro Yamamoto, Kumamoto (JP);
Hiroshi Arima, Kumamoto (JP);
Kousuke Yoshihara, Kumamoto (JP);
Yuichi Yoshida, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/025,300

(22) Filed: Feb. 11, 2011

(65) Prior Publication Data

US 2011/0200321 A1    Aug. 18, 2011

(30) Foreign Application Priority Data

Feb. 15, 2010   (JP) ................................. 2010-030546

(51) Int. Cl.
*G03B 13/00*   (2006.01)
*G03D 5/00*    (2006.01)
(52) U.S. Cl. ........................................ 396/577; 396/611
(58) Field of Classification Search .................. 396/577, 396/611
See application file for complete search history.

(56) References Cited

U.S. PATENT DOCUMENTS

| 6,458,208 | B1* | 10/2002 | Anai et al. | 118/52 |
| 7,008,124 | B2* | 3/2006 | Miyata | 396/611 |
| 2005/0191051 | A1* | 9/2005 | Miyata | 396/611 |
| 2009/0202951 | A1* | 8/2009 | Yamamoto et al. | 430/322 |
| 2011/0200952 | A1* | 8/2011 | Takiguchi et al. | 430/434 |
| 2011/0200953 | A1* | 8/2011 | Arima et al. | 430/434 |

FOREIGN PATENT DOCUMENTS

| JP | 04-097526 A | 3/1992 |
| JP | 07-175223 A | 7/1995 |
| JP | 07-245254 A | 9/1995 |
| JP | 10-050606 A | 2/1998 |
| JP | 2005-277268 A | 10/2005 |
| JP | 2008-072016 A | 3/2008 |
| JP | 2009-094406 A | 4/2009 |
| JP | 2009-283716 A | 12/2009 |

OTHER PUBLICATIONS

Japanese Office action for 2010-030546 dated Jan. 31, 2012.
Japanese Office action for 2010-030546 dated Apr. 24, 2012.

* cited by examiner

*Primary Examiner* — Rodney Fuller
(74) *Attorney, Agent, or Firm* — Pearne & Gordon LLP

(57) ABSTRACT

A coating and developing apparatus develops a substrate of which surface is coated with resist and exposed to lights. The coating and developing apparatus includes a developing module; a cleaning module; and a transfer mechanism configured to transfer a substrate developed by the developing module to the cleaning module. The developing module includes an airtightly sealed processing vessel configured to form a processing atmosphere; a temperature control plate provided in the processing vessel and mounts thereon the substrate and cools the substrate; and an atmosphere gas supply unit configured to supply an atmosphere gas including mist of a developing solution to a surface of the substrate within the processing vessel. The cleaning module includes a mounting table configured to mount thereon the substrate; and a cleaning solution supply unit configured to supply a cleaning solution to the substrate mounted on the mounting table.

11 Claims, 23 Drawing Sheets

DEVELOPING ATMOSPHERE GAS

WAFER W1

WAFER W2

WAFER W3

WAFER W1

WAFER W2

WAFER W3

WAFER W1

WAFER W1

WAFER W2

WAFER W2

COATING AND DEVELOPING APPARATUS, DEVELOPING METHOD AND NON-TRANSITORY MEDIUM

CROSS-REFERENCE TO RELATED APPLICATION

This application claims the benefit of Japanese Patent Application No. 2010-030546 filed on Feb. 15, 2010, the entire disclosures of which are incorporated herein by reference.

FIELD OF THE INVENTION

The present disclosure relates to a coating and developing apparatus for forming a resist film on a substrate and developing an exposed substrate and also relates to a developing method and a non-transitory medium.

BACKGROUND OF THE INVENTION

In a photoresist process which is one of semiconductor manufacturing processes, a surface of a semiconductor wafer (hereinafter, referred to as "wafer") is coated with resist, the resist is exposed to light via a preset pattern and developed so as to form a resist pattern. Generally, such a process is performed by a system in which a coating and developing apparatus that coats and develops resist is connected with an exposure apparatus. In a conventional developing process for photoresist (hereinafter, referred to as "resist") by a developing module provided in the coating and developing apparatus, a developing solution is supplied through a nozzle onto a surface of a wafer that has been coated with resist and exposed to light via a preset pattern. To obtain process uniformity in a wafer surface, the developing solution is supplied such that a liquid film is uniformly formed on the entire surface of the wafer, and the resist is dissolved by the liquid film.

To form the liquid film of the developing solution, there is known a method (puddle type developing process) for accumulating liquid on the entire surface of the wafer by discharging the developing solution onto the stationary wafer while moving a nozzle having an elongated discharge port, or there is known a method (puddless type developing process) for supplying the developing solution in, e.g., a diametric direction of the wafer while rotating the wafer around a vertical axis and coating the developing solution on the wafer by a centrifugal force.

In consideration of the composition of materials of the resist, a reaction between the developing solution and the resist may progress for a relatively short time. In the aforementioned methods, however, a great amount of developing solution has been used to form a uniform liquid film, and a great amount of time has been taken to supply the developing solution onto the wafer. Since the process of supplying the developing solution is so time-consuming, a certain amount of time, e.g., about 30 seconds to about 60 seconds has been required till the reaction between the developing solution and the resist is completed after the supply of the developing solution is begun.

Meanwhile, a liquid immersion exposure process may be performed as an exposure process for a wafer. To suppress an influence of a liquid used in this liquid immersion exposure process upon the wafer, a high water-repellent resist tends to be used. If the high water-repellent resist is used, however, some portions on the resist may not be wet with the developing solution when the resist is developed by the aforementioned methods. Further, a diameter of the wafer tends to increase, and as the diameter of the wafer increases, there is an increasing tendency for the areas not to be wet with the developing solution on the surface of the high water-repellent resist. Accordingly, to form a uniform liquid film of the developing solution for the high water-repellent resist, a greater amount of developing solution may be required, which may cause increase of processing cost and supply time for the developing solution. As a result, high throughput of a coating and developing apparatus may not be achieved.

Thus, the present inventors have considered supplying mist of the developing solution to the wafer to form the liquid film on the entire surface of the wafer. Meanwhile, in a conventional developing apparatus, a mechanism for supplying a developing solution through a nozzle and a cleaning mechanism for cleaning a wafer are installed in the same apparatus. This cleaning mechanism supplies a cleaning solution to the wafer on which the liquid film of the developing solution is formed and performs a cleaning process on the wafer.

Even in the above-described developing apparatus which supplies mist of the developing solution to the wafer, the developing mechanism for supplying the mist of the developing solution and the cleaning mechanism can be installed in the same apparatus in the same manner as the conventional developing apparatus. However, with this configuration, while the mist of the developing solution is supplied to the wafer and while the liquid film of the developing solution and the resist react with each other, the cleaning mechanism cannot perform a cleaning process to the wafer and should stop the process and wait to resume. On the contrary, while the cleaning mechanism is performing a cleaning process, the mechanism for supplying the mist of the developing solution cannot perform a process to the wafer and should stop the process and wait to resume. As a result, sufficient improvement in throughput may not be achieved.

In Patent Document 1, it is disclosed that mist of a developing solution is supplied into a chamber accommodating a substrate therein. However, the substrate is temperature-controlled by being heated on a hot plate, and, thus, an evaporation amount of the developing solution become increased, which may cause an increase in processing costs.

Patent Document 1: Japanese Patent Laid-open Publication No. 2005-277268 (paragraphs [0139], [0141] and [0178])

BRIEF SUMMARY OF THE INVENTION

In view of the foregoing, the present disclosure provides a coating and developing apparatus capable of forming a liquid film of a developing solution on an entire surface of a substrate with high uniformity and achieving high throughput, and the present disclosure also provides a developing method and a non-transitory medium storing a computer program for implementing the developing method.

In accordance with one aspect of the present disclosure, there is provided a coating and developing apparatus that develops a substrate of which surface is coated with resist and exposed to lights. The coating and developing apparatus includes at least one developing module; a cleaning module; and a transfer mechanism configured to transfer a substrate developed by the developing module to the cleaning module. The developing module includes an airtightly sealed processing vessel configured to form a processing atmosphere therein; a temperature control plate that is provided in the processing vessel and mounts thereon the substrate and cools the substrate; and an atmosphere gas supply unit configured to supply an atmosphere gas including mist of a developing solution to a surface of the substrate within the processing vessel. The cleaning module includes a mounting table configured to mount thereon the substrate; and a cleaning solution supply unit configured to supply a cleaning solution to the substrate mounted on the mounting table.

By way of example, the coating and developing apparatus may further include a heating module configured to heat the exposed substrate before a developing process; and a main transfer mechanism configured to deliver the substrate which has been heated by the heating module to the developing module. The transfer mechanism configured to transfer the substrate from the developing module to the cleaning module may be provided separately from the main transfer mechanism and accommodated in a common housing together with the developing module and the cleaning module to serve as a developing unit. The at least one developing module may be plural in number and the developing modules may be stacked in multi layers.

The atmosphere gas supply unit may supply an atmosphere gas including vapor of the developing solution into the processing vessel in order to form a liquid film by condensing the developing solution on a surface of the substrate instead of supplying the atmosphere gas including the mist of the developing solution in order to form a liquid film of the developing solution on the surface of the substrate. The temperate control plate may control a temperature of the substrate so as to condense the vapor onto the surface of the substrate. The atmosphere gas supply unit may include, by way of example, a heating unit configured to heat the atmosphere gas. Here, by way of example, the atmosphere gas may be heated to a temperature higher than a saturation temperature of the developing solution in a heating atmosphere.

In accordance with another aspect of the present disclosure, there is provided a developing method for developing a substrate of which surface is coated with resist and exposed to light. The developing method includes loading the substrate into an airtightly sealed processing vessel configured to form a processing atmosphere therein; mounting the substrate on a temperature control plate provided in the processing vessel; cooling the substrate by the temperature control plate; supplying an atmosphere gas including mist of a developing solution onto the surface of the substrate loaded into the processing vessel; and unloading the substrate from the processing vessel, loading the substrate into a cleaning module, and cleaning the substrate with a cleaning solution.

The developing method may further include supplying an atmosphere gas including vapor of the developing solution onto the surface of the substrate instead of supplying the atmosphere gas including the mist of the developing solution thereto; and controlling a temperature of the substrate by the temperature control plate to condense the vapor is condensed onto the surface of the substrate. By way of example, the developing method may further include heating the atmosphere gas by a heating unit. Here, by way of example, the atmosphere gas may be heated to a temperature higher than a saturation temperature of the developing solution in a heating atmosphere.

In accordance with still another aspect of the present disclosure, there is provided a non-transitory medium that stores therein a computer program to be used in a coating and developing apparatus. The computer program may include processing steps for implementing the above-mentioned developing method.

In accordance with the present disclosure, there are provided the developing module that supplies the mist of the developing solution to the substrate mounted on the temperature control plate for cooling the substrate, the cleaning module that supplies the cleaning solution to the substrate, and the transfer mechanism that transfers the substrate developed by the developing module to the cleaning module. Therefore, the substrate can be processed in each of the developing module and the cleaning module, and, thus, a decrease in throughput can be suppressed.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

First Embodiment

Figure 1:
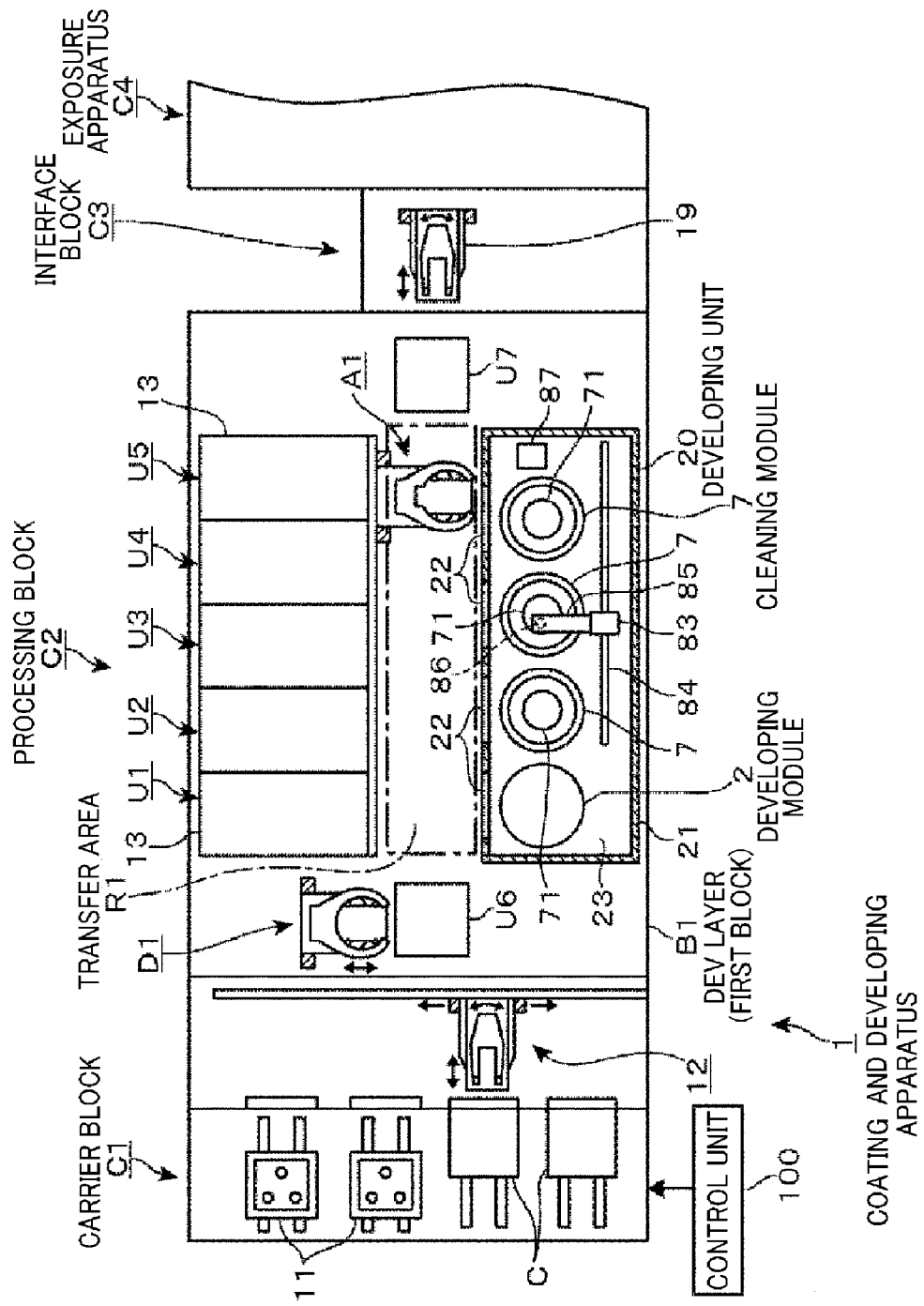
FIG. 1 is a plane view of a coating and developing apparatus in accordance with an embodiment of the present disclosure.
Figure 2:
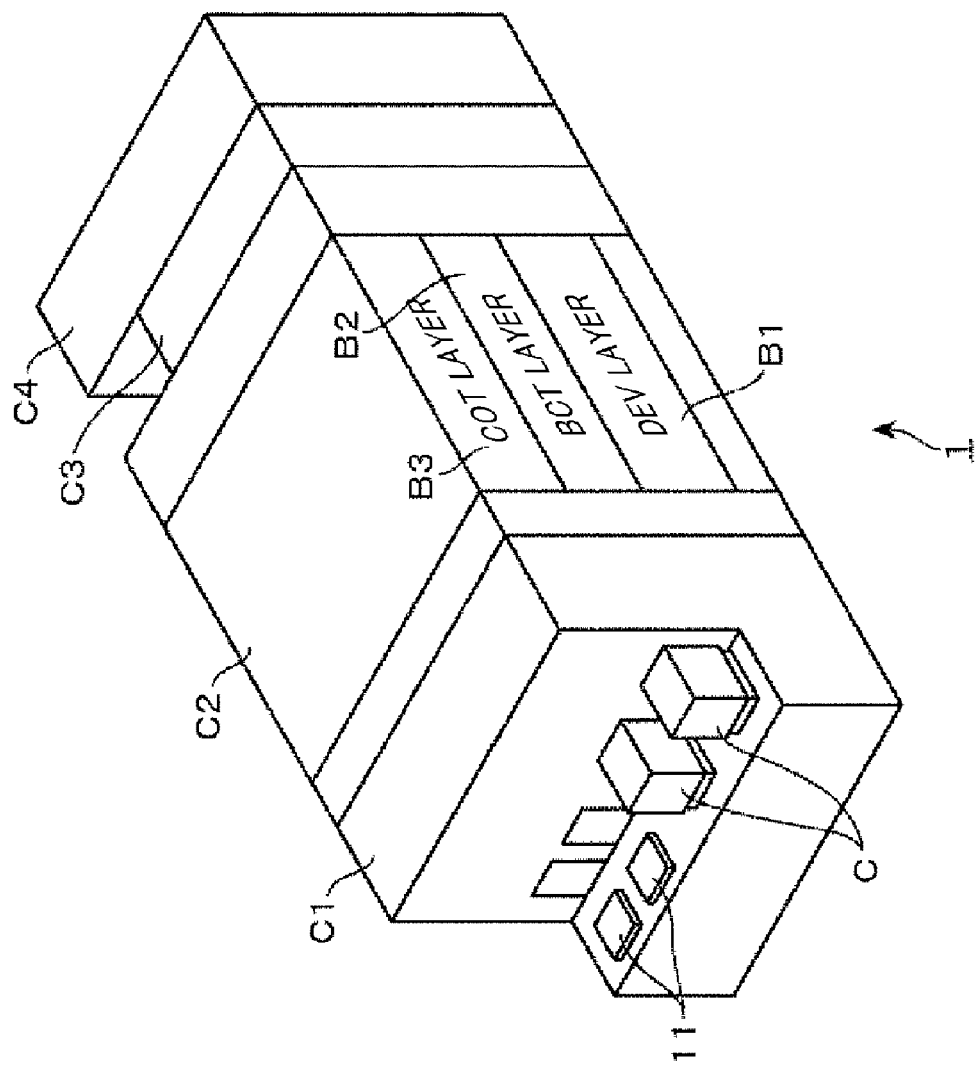
FIG. 2 is a perspective view of the coating and developing apparatus.
Figure 3:
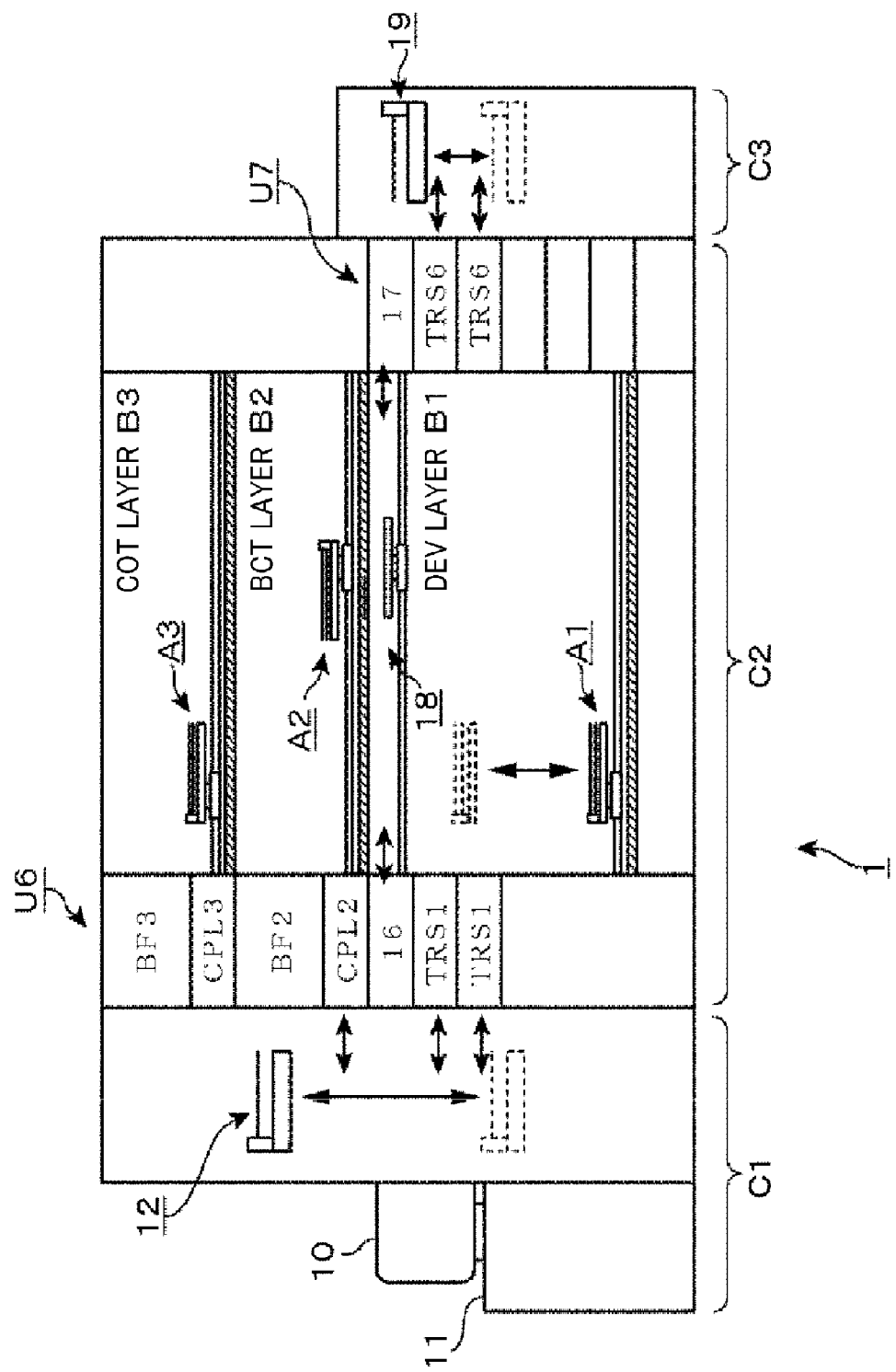
FIG. 3 is a longitudinal cross sectional view of the coating and developing apparatus.

There will be explained a coating and developing apparatus 1 to which a developing system of the present disclosure is applied. FIG. 1 is a plane view of a resist pattern forming system in which the coating and developing apparatus 1 is connected with an exposure apparatus 4, FIG. 2 is a perspective view of this system, and FIG. 3 is a longitudinal cross sectional view thereof. In the coating and developing apparatus 1, a carrier block C1 is provided, and a transfer arm 12 takes out a wafer W from an airtight carrier C mounted on a mounting table 11, transfers the wafer W to a processing block C2 and takes out the processed wafer W from the processing block C2 and then returns the processed wafer W to the carrier C.

As depicted in FIG. 2, in this embodiment, the processing block C2 may include a first block (DEV layer) B1 for performing a developing process; a second block (BCT layer) B2 for forming an antireflection film formed on a lower layer of a resist film; and a third block (COT layer) B3 for forming the resist film, and the blocks are stacked up in sequence from the bottom.

Each layer of the processing block C2 has the same configuration when viewed from the top. By way of example, the third block (COT layer) B3 may include a resist film forming module that forms, for example, a water-repellent resist film as a coating film; rack units as processing module sets that include heating modules and cooling modules and perform a pre-treatment and an post-treatment of a process performed by the resist film forming module; and a transfer arm A3 provided between the resist film forming module and the processing module sets to transfer the wafer W therebetween. By way of example, a water-repellent positive resist is coated by the resist film forming module. The coating and developing apparatus and a coating and developing method of the present disclosure may also be applied to an organic developing process or a resist film made of negative resist. Here, the organic developing process refers to a developing process of mainly using an organic material as a developing solution.

The rack units are positioned along a transfer area R1 where the transfer arm A3 moves and the heating module and the cooling module are stacked in each rack unit. The heating module may include a heating plate for heating the wafer mounted thereon and the cooling module may include a cooling plate for cooling the wafer mounted thereon.

Provided in the second block (BCT layer) B2 is an antireflection film forming module corresponding to the resist film forming module, and this block has the same configuration as the COT layer B3 except that the antireflection film forming module supplies the wafer W with a chemical solution for forming the antireflection film as a coating solution instead of the resist.

As for the first block (DEV layer) B1, developing units 20 corresponding to the resist film forming module are stacked in two layers within the single DEV layer B1. The developing unit 20 may include a housing 21; a developing module 2 for supplying vapor of the developing solution to the wafer W within the housing 21; and a cleaning module 7 for cleaning the developed wafer W within housing 21.

A configuration of the developing units 20 will be described later. There are provided rack units U1 to U5 including a multiple number of stacked modules so as to face the developing units 20. These rack units U1 to U5 may include heating modules 13 for performing a heating process before and after a developing process.

Further, within the DEV layer B1, there is provided a transfer arm A1 as a main transfer mechanism for transferring the wafer W to each module included in the two-layer developing units 20 or each heating module 13. That is, the transfer arm A1 is configured to transfer the wafer W to the two-layer developing units.

Furthermore, in the processing block C2, as depicted in FIGS. 1 and 3, a rack unit U6 is provided and wafers W are transferred in sequence from the carrier block C1 to one of transit modules, e.g., a transit module CPL2 corresponding to the second block (BCT layer) B2. A transfer arm A2 within the second block (BCT layer) B2 receives the wafer W from the transit module CPL2 and transfers the received wafer W to each unit (the antireflection film forming module and the processing module sets including heating modules and cooling modules), and an antireflection film is formed on the wafer W by each unit.

Thereafter, the wafer W is transferred to a transit module BF2 of the rack unit U6, a transfer arm D1, and a transit module CPL3 of the rack unit U6 in sequence, and the wafer W is temperature-controlled to, for example, about 23° C. by the transit module CPL3. Then, the wafer W is loaded into the third block (COT layer) B3 by the transfer arm A3, and a resist film is formed on the wafer W by the resist film forming module. Further, the wafer W is transferred to a transit module BF3 of the rack unit U6, via the transfer arm A3, the transit module BF3 of the rack unit U6, and the transfer arm D1.

Provided at an upper part in the DEV layer B1 is a shuttle 18 as a dedicated transfer mechanism for directly transferring the wafer W from a transit unit 16 in the rack unit U6 to a transit unit 17 in a rack unit U7. The wafer W on which the resist film has been formed is transferred from the transit module BF3 to the transit unit 16 by the transfer arm D1 and delivered to the shuttle 18 from the transit unit 16. Then, the wafer W is directly transferred to the transit unit 17 of the rack unit U7 and received by an interface arm 19 provided in an interface block C3. Meanwhile, in FIG. 3, the transit module expressed as "CPL" serves as a cooling module for controlling a temperature and the transit modules expressed as "BF" serve as buffer modules capable of mounting a multiple number of wafers W therein.

Subsequently, the wafer W is transferred by the interface arm 19 to an exposure apparatus C4, and an exposure process such as a liquid immersion exposure process is performed onto the wafer W. Thereafter, the wafer W is returned to the processing block C2 while being mounted on a transit module TRS6 of the rack unit U7. The returned wafer W is transferred between the modules of the first block (DEV layer) B1 by the transfer arm A1 of the DEV layer B1. After a heating (post exposure baking: PEB) process by the heating modules of the rack units U3 to U5, a developing solution film 50 is formed on the wafer W by the developing module 2 as described below and a cleaning process is performed on the wafer W by the cleaning module 7. Then, a heating (post baking: POST) process is performed to the wafer W by the heating modules of the rack units U3 to U5. Thereafter, the wafer W is delivered to a transit module TRS1 of the rack unit U6 by the transfer arm A1 and then returned to the carrier C via the transfer arm 12.

An operation of each unit in the coating and developing apparatus 1 is controlled by a control unit 100. The control unit 100 may be composed of, e.g., a computer and include a non-illustrated program storage unit. Stored in the program storage unit is a program, e.g., software, including commands for implementing the developing process and the cleaning process by an operation of the coating and developing apparatus 1 to be described later. The control unit 100 reads out the program and sends a control signal to each unit of the apparatus. Accordingly, operations of respective modules and transfer between the modules may be controlled. The program may be stored in the program storage unit by being stored in a non-transitory medium such as a hard disk, a compact disk, a magnet optical disk or a memory card.

Figure 4:
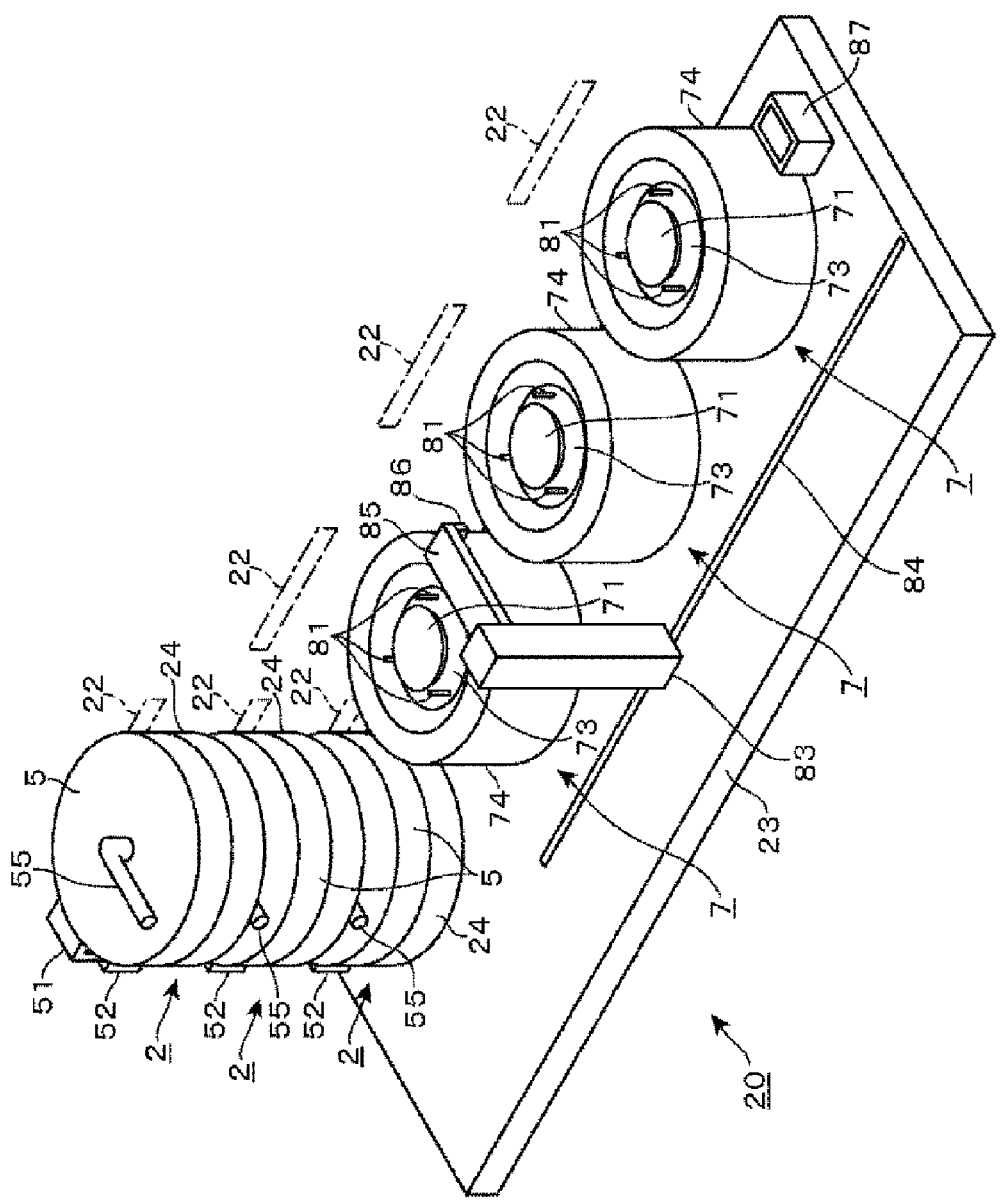
FIG. 4 is a perspective view of a developing unit included in the coating and developing apparatus.

Hereinafter, there will be explained the developing unit 20 with reference to FIG. 4. The developing unit 20 may include three developing modules 2 and three cleaning modules 7 on a base 23 within the housing 21. The developing modules 2 are stacked to each other, and the cleaning modules 7 and the developing modules 2 are positioned along a direction of forming the transfer area R1. Provided in the housing 21 are transfer ports 22 through which the wafer W is delivered between each module and transfer arm A1. The inside of the housing 21 is maintained at a predetermined humidity.

Figure 5:
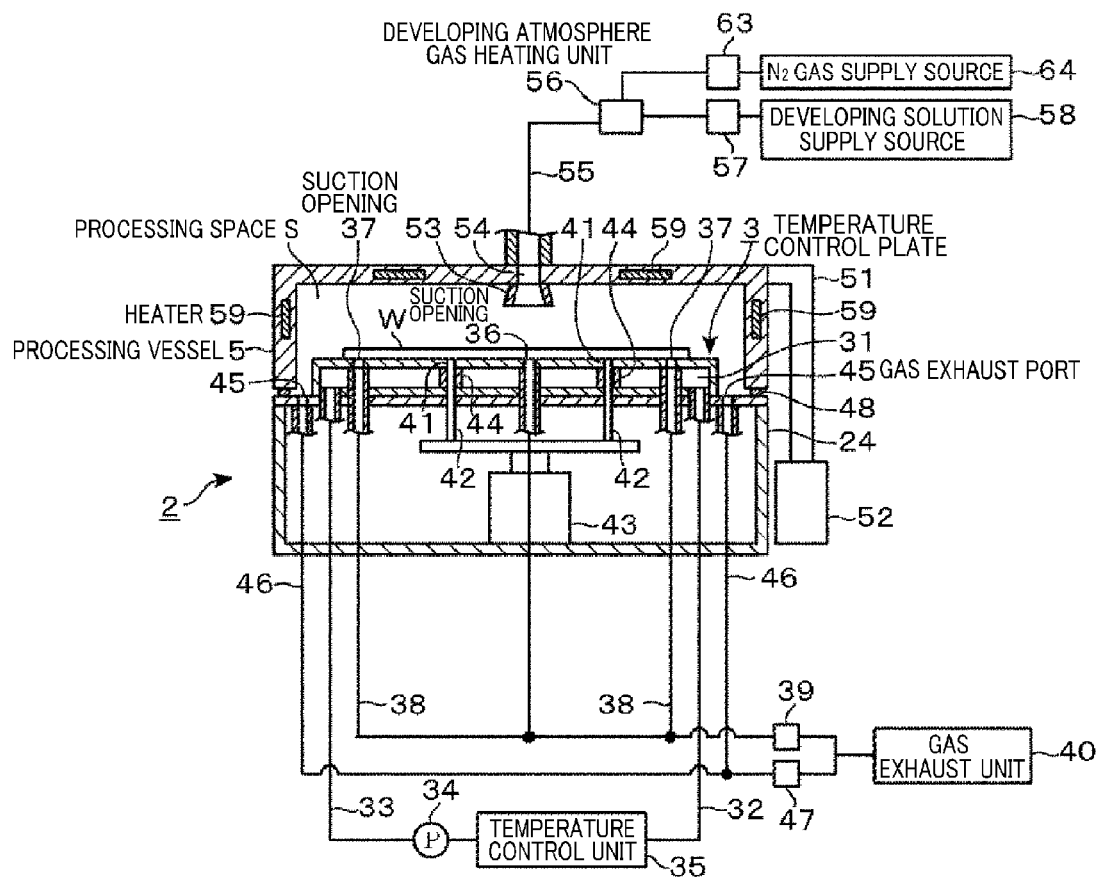
FIG. 5 is a longitudinal cross sectional view of a developing module included in the developing unit.
Figure 6:
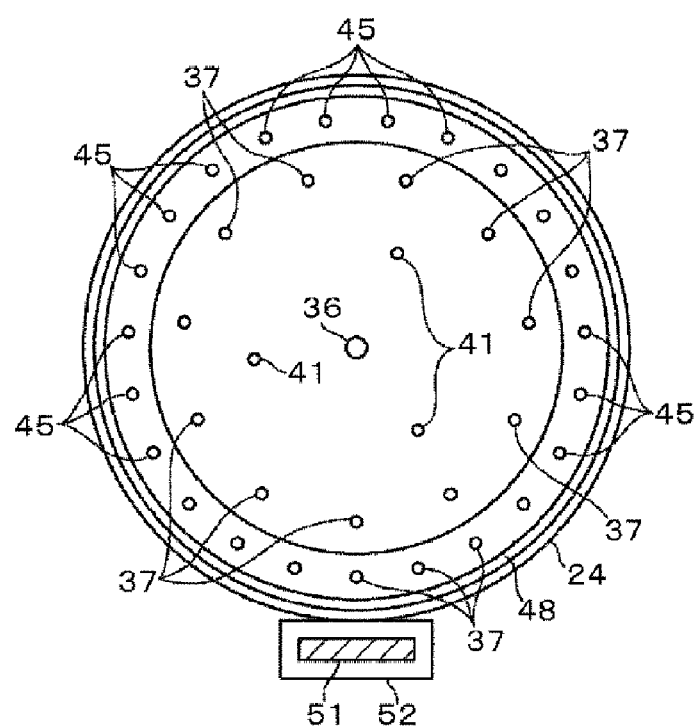
FIG. 6 is a plane view of the developing module.

Hereinafter, there will be explained the developing module 2 with reference to FIGS. 5 and 6. FIGS. 5 and 6 are a longitudinal cross sectional view and a plane view of the developing module 2, respectively. The developing module 2 may include a support 24, and a circular temperature control plate 3 is provided on the support 24. A flow path 31 for a temperature-controlled fluid, e.g., water, is provided within the temperature control plate 3. The temperature control plate 3 is connected with one ends of a temperature-controlled water supply pipe 32 and a temperature-controlled water collection pipe 33, and the other ends of the temperature-controlled water supply pipe 32 and the temperature-controlled water collection pipe 33 are connected with a pump 34. A temperature control unit 35 is provided on the temperature-controlled water supply pipe 32, and the temperature control unit 35 may include a heater for heating water supplied therein and a coolant path for a coolant to cool the water by heat exchange. By controlling an output of the heater and a flow rate of the coolant, the temperature of the wafer may be controlled to a temperature set by a user.

The temperature-controlled water supply pipe 32, the temperature-controlled water collection pipe 33 and the flow path 31 form a circulation path for temperature-controlled water, and the water supplied into the temperature-controlled water supply pipe 32 by the pump 34 is supplied into the flow path 31 after its temperature is controlled by the temperature control unit 35. Then, the water is collected from the flow path 31 through the temperature-controlled water collection pipe 33 by the pump 34 and then is supplied again into the temperature-controlled water supply pipe 32 and the temperature of the temperature-controlled water is controlled. By flowing the temperature-controlled water as stated above, a temperature of an entire surface of the temperature control plate 3 becomes uniform and is controlled to be substantially the same as the temperature of the water adjusted by the temperature control unit 35. Further, the temperature of the wafer W mounted on the temperature control plate 3 is controlled to be substantially the same as the temperature of the surface of the temperature control plate 3. As described below, the wafer W is cooled by being mounted on this temperature control plate 3.

A suction opening 36 is opened in a central surface of the temperature control plate 3, and a multiple number of suction openings 37 are opened in a peripheral surface of the temperature control plate 3 along the circumference of the temperature control plate 3. One ends of gas exhaust pipes 38 are respectively connected with the suction openings 36 and 37, and the other ends of the gas exhaust pipes 38 are joined together and connected with a gas exhaust unit 40 including a vacuum pump via a flow rate controller 39. The flow rate controller 39 may include a valve and/or a mass flow controller and control a gas exhaust amount.

Three holes 41 are provided in the surface of the temperature control plate 3 along the circumference of the temperature control plate 3, and the three elevating pins 42 are inserted into the holes 41 in a thickness direction of the temperature control plate 3 (only two elevating pins 42 are shown in FIG. 5 for the simplicity of illustration). The elevating pins 42 are protruded from or retracted into the surface of the temperature control plate 3 by an elevating mechanism 43 and transfers the wafer W between the transfer arm A1 and the temperature control plate 3. Sealing members 44 for preventing leakage of the temperature-controlled water are provided around the elevating pins 42 within the temperature control plate 3. By way of example, a lower part of the elevating mechanism 43 is surrounded by the support 24.

The support 24 is provided with a multiple number of gas exhaust ports 45 arranged to surround the temperature control plate 3, and one ends of gas exhaust pipes 46 are connected with the gas exhaust ports 45. The other ends of the gas exhaust pipes 46 are joined together and connected with the gas exhaust unit 40 via a flow rate controller 47. The flow rate controller 47 may have the same configuration as that of the flow rate controller 39. Further, an O-ring 48 is provided on the support 24 to surround the gas exhaust ports 45. Further, by way of example, on the gas exhaust pipes 46, an upstream side of the flow rate controller 39 is shared by three developing modules 2.

The processing vessel 5 is installed above the temperature control plate 3, and the processing vessel 5 is configured as a flat circular vessel having an open bottom. The processing vessel 5 is connected with an elevating mechanism 52 via a support 51 and is moved up and down by the elevating mechanism 52. As depicted in FIG. 5, a bottom end of the processing vessel 5 comes into contact with the O-ring 48 when the processing vessel 5 is lowered, so that an airtightly sealed processing space (processing atmosphere) S is formed in the processing vessel 5. Heaters for controlling a temperature of an inner wall of the processing vessel 5 are installed in a wall of the processing vessel 5. Provided in a central bottom surface of a ceiling of the processing vessel 5 is a nozzle 53 for supplying mist of the developing solution into the processing space S. The nozzle 53 is connected with one end of a developing atmosphere gas supply pipe 55 through an opening 54 provided in a central portion of the ceiling of the processing vessel 5.

The other end of the developing atmosphere gas supply pipe 55 is connected with a developing solution supply source 58 storing therein the developing solution via a developing atmosphere gas heating unit 56 and a flow rate controller 57 in this sequence. The developing solution supply source 58 may include a non-illustrated force-feeding unit and supply the developing solution to the downstream side of the developing atmosphere gas supply pipe 55. The flow rate controller 57 may include a valve and/or a mass flow controller, like the flow rate controllers 39 and 47 and control a supply flow rate of the developing solution to the downstream side. The developing atmosphere gas heating unit 56 may mix the developing solution supplied through the developing atmosphere gas supply pipe 55 and a $N_2$ gas supplied through an inert gas supply pipe 61 to be described later and generate the developing atmosphere gas including mist of the developing solution (hereinafter, referred to as "developing mist").

The generated developing atmosphere gas is supplied into the processing space S via the developing atmosphere gas supply pipe 55. Further, the developing atmosphere gas heating unit 56 may include a heating device such as a heater and heat the developing atmosphere gas to a preset temperature. By way of example, a flow rate of the developing solution supplied into the developing atmosphere gas heating unit 56 by the flow rate controller 57 during a developing process and the temperature of the developing atmosphere gas may be regulated constant in processing each wafer W. Further, a supply time of the developing atmosphere gas into the processing space S and a gas exhaust amount from the gas exhaust ports 45 and the suction openings 36 and 37 may also be regulated constant for the each wafer W. Accordingly, a constant amount of developing mist may adhere to each wafer W and the developing solution film 50 of a predetermined thickness may be formed. The developing atmosphere gas supply pipe 55 and the developing atmosphere gas heating unit 56 serve as an atmosphere gas supply unit.

One end of the inert gas supply pipe 61 is connected with the developing atmosphere gas heating unit 56, and the other end of the inert gas supply pipe 61 is connected with a $N_2$ gas supply source 64 storing therein an inert gas such as a $N_2$ gas. The $N_2$ gas may be supplied into the processing space S while being included in the developing atmosphere gas as stated above, or the $N_2$ gas may be independently supplied into the processing space S as a purge gas through the developing atmosphere gas supply pipe 55. Even when the $N_2$ gas is independently supplied into the processing space S, the $N_2$ gas has been heated to, for example, a predetermined temperature by the developing atmosphere gas heating unit 56.

Then, after a lapse of a preset time after forming the developing solution film 50, a liquid component of the developing solution film 50 is removed, and, thus, the surface of the wafer W is dried and a reaction between the developing solution and the resist is stopped. Then, the wafer W is transferred to the cleaning module 7 and cleaned, and a resist pattern is developed.

Figure 7:
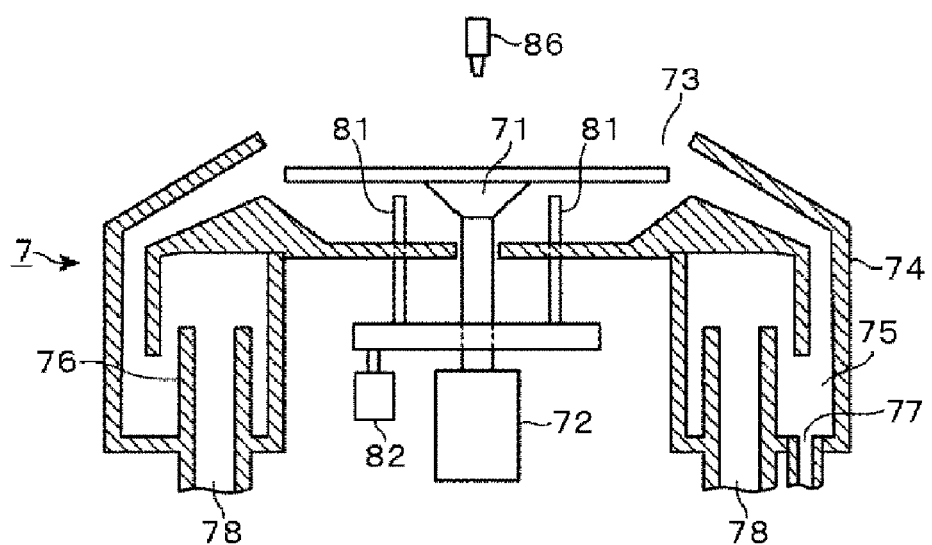
FIG. 7 is a longitudinal cross sectional view of a cleaning module included in a developing unit.

Hereinafter, there will be explained the cleaning module 7 with reference to FIG. 7 which is a longitudinal cross sectional view of the cleaning module 7. The cleaning module 7 may include a spin chuck 71 as a mounting table that attracts a central area of a rear surface of the wafer W and holds the wafer W horizontally. The spin chuck 71 is configured to be rotatable around a vertical axis while holding the wafer W via a rotation driving mechanism 72. Further, there is provided a cup 74 having an upper opening 73 so as to surround the wafer W on the spin chuck 71. At a lower part of the cup 74, there is a provided a liquid sump 75 formed in, for example, a recess shape. The liquid sump 75 is divided into an outer region and an inner region by a partition wall 76 along the entire circumference of a lower side of a periphery of the wafer W. Provided at a bottom of the outer region is a liquid drain port 77 and provided at a bottom of the inner region is a gas exhaust port 78 for exhausting a processing atmosphere.

Figure 9A:
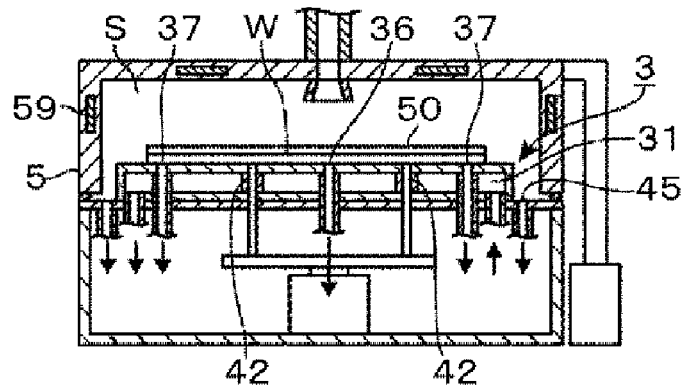
FIGS. 9A to 9C are process diagrams for illustrating a process sequence performed by the developing unit.
Figure 9B:
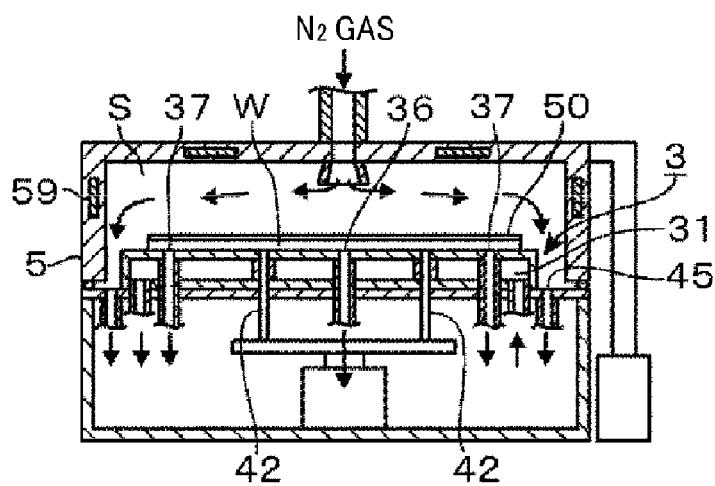
Figure 9C:
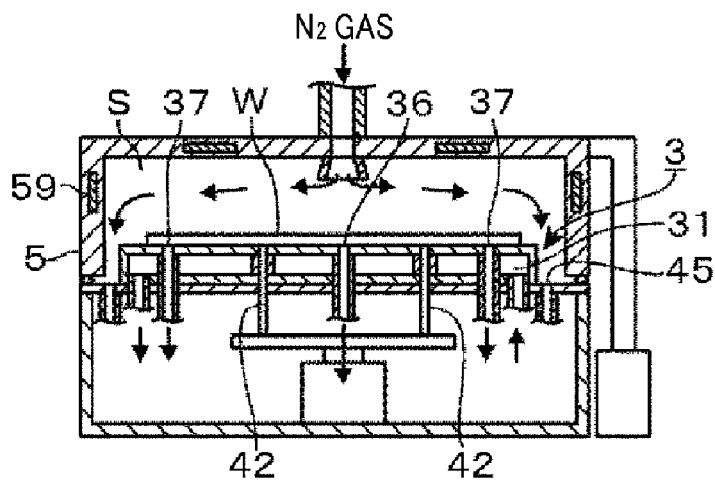

A reference numeral 81 in the drawings denotes elevating pins and three elevating pins 81 are provided in the cup 74 (only two elevating pins 81 are shown in FIGS. 9A to 9C for the simplicity of illustration). An elevating mechanism 82 elevates the elevating pins 81 and the wafer W is delivered by the elevating pins 81 between the transfer arm A1 and the spin chuck 71. Further, as depicted in FIG. 4, provided on the base 23 is a driving mechanism 83. The driving mechanism 83 moves along a guide 84 in an arrangement direction of the cleaning modules 7 and elevates an arm 85 connected to the driving mechanism 83. The arm 85 is provided with a cleaning solution supply nozzle 86 serving as a supply unit commonly used in each cleaning module 7. At a side of the cleaning module 7, there is provided a standby section 87 where the cleaning solution supply nozzle 86 is on standby.

Figure 10A:
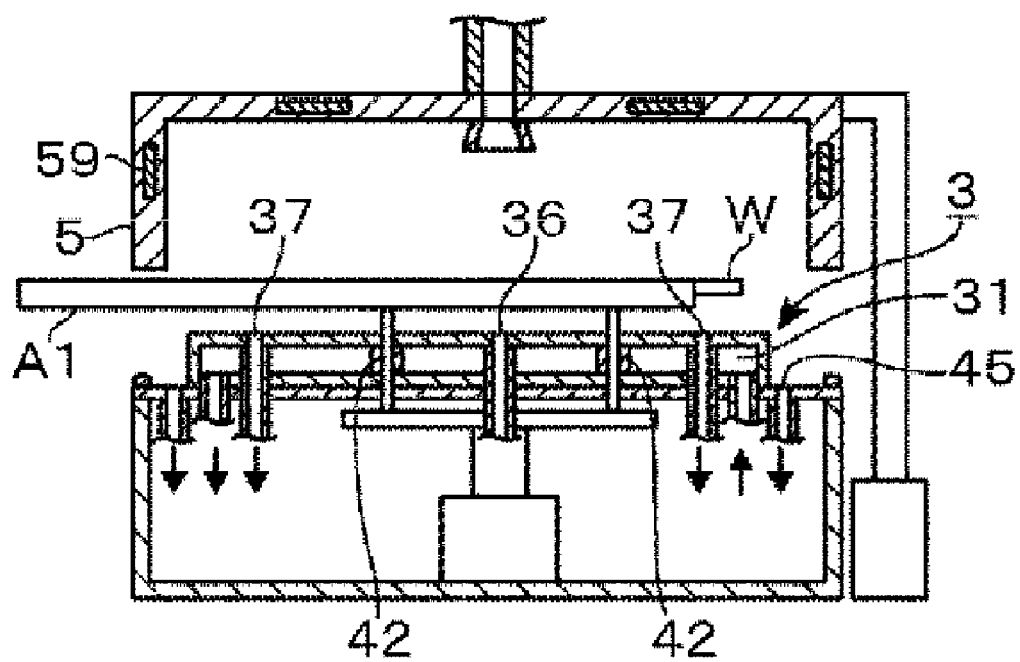
FIGS. 10A to 10B are process diagrams for illustrating a process sequence performed by the developing unit.
Figure 10B:
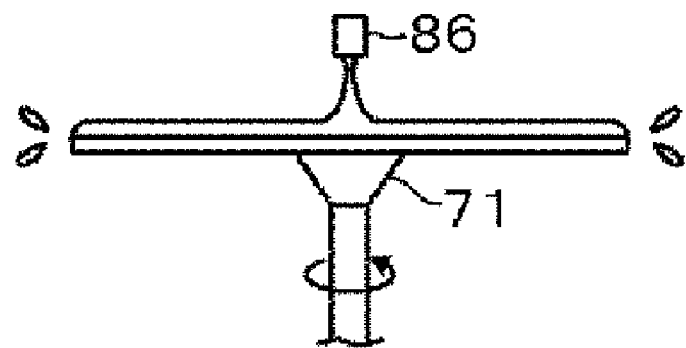
Figure 11A:
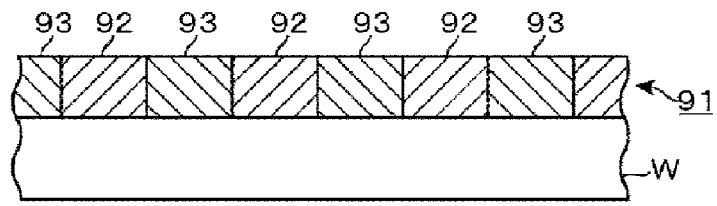
FIGS. 11A to 11E are explanatory diagrams showing changes in a surface of a wafer.

Hereinafter, there will be explained a sequence of a process performed by the developing module 2 and the cleaning module 7 with reference to FIGS. 8A to 11E. FIGS. 8A to 10B illustrate an operation of each module and FIGS. 11A to 11E show a status of a surface of the wafer W. The temperature-controlled water is supplied into the flow path 31 of the temperature control plate 3 and the surface of the temperature control plate 3 is controlled to a preset temperature, e.g., about 20° C. Further, evacuation in a certain gas exhaust amount is performed through the gas exhaust ports 45 and the suction openings 36 and 37, and temperature of the inner wall of the processing vessel 5 is controlled by the heaters 59 to a temperature the same as, e.g., a temperature of a developing atmosphere gas supplied onto the wafer W. Subsequently, the transfer arm A1 is loaded into the housing 21 of the developing unit 20 while holding thereon the wafer W and transfers the wafer W to above the temperature control plate 3. FIG. 11A shows the wafer W at this time, and a resist film 91 on the surface includes an exposed part 92 and a non-exposed part 93.

Figure 8A:
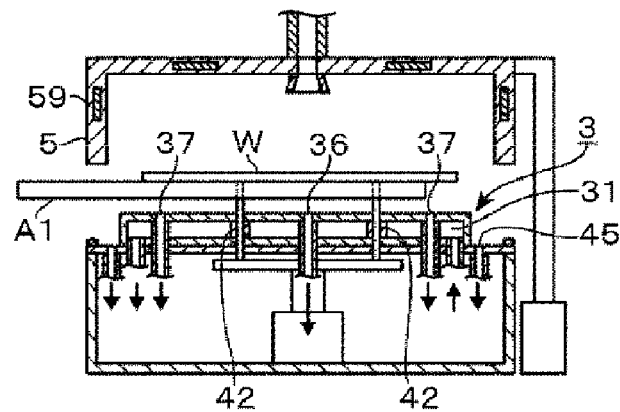
FIGS. 8A to 8C are process diagrams for illustrating a process sequence performed by the developing unit.
Figure 8B:
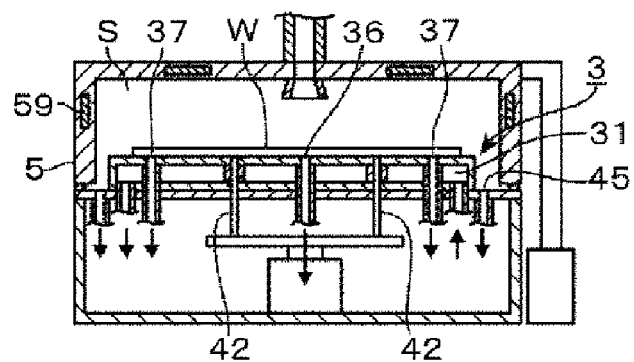
Figure 8C:
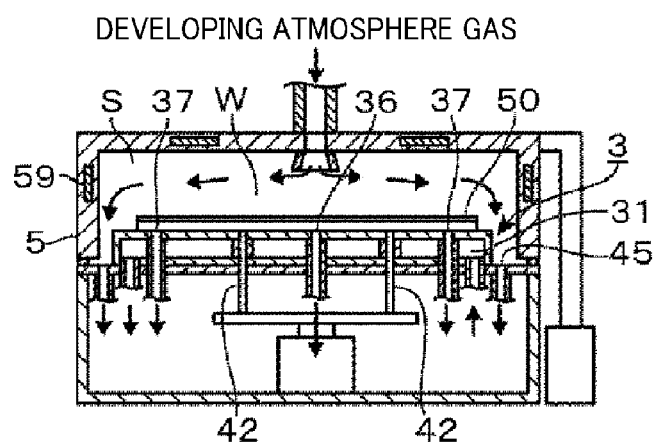

The elevating pins 42 are raised to hold the wafer W thereon (FIG. 8A). Then, the transfer arm A1 is retreated, the elevating pins 42 are lowered, and the wafer W is mounted on the temperature control plate 3. A central portion and a peripheral portion of the wafer W are suctioned by the suction openings 36 and 37, so that the entire rear surface of the wafer W firmly adheres to the surface of the temperature control plate 3. The entire wafer W is cooled to have a temperature substantially the same as the surface temperature of the temperature control plate 3, and the processing vessel 5 is lowered to thereby form the processing space S (FIG. 8B).

Figure 11B:
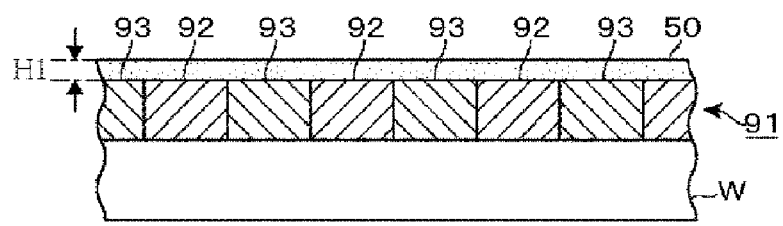

A developing atmosphere gas including developing mist is generated by the developing atmosphere gas heating unit and is supplied into the processing space S. If the developing mist adheres to the wafer W, and the developing solution film 50 of a predetermined thickness is formed (FIG. 8C), the supply of the developing atmosphere gas and the evacuation through the gas exhaust ports 45 are stopped, and a reaction between the developing solution film 50 and resist may progress (FIGS. 9A and 11B). In order to remove the developing solution film 50 later and save a usage amount of the developing solution, an adhesion amount of the developing mist is controlled such that a film thickness H1 of the developing solution film 50 may be in a range of, for example, from about 1 μm to about 100 μm.

Figure 11C:
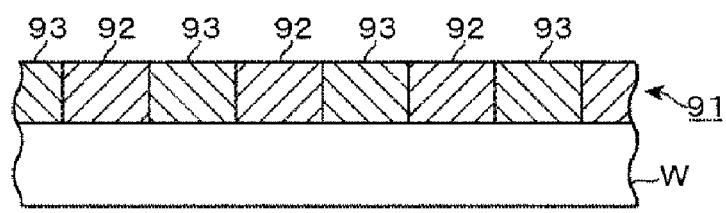

After the lapse of the preset time from the beginning of the supply of the developing atmosphere gas into the processing space S, the evacuation through the gas exhaust ports 45 is resumed and a $N_2$ gas heated to a predetermined temperature is supplied into the processing space S (FIG. 9B). Accordingly, the developing atmosphere gas within the processing space S is purged and removed, and the surface of the wafer W is dried by the $N_2$ gas (FIGS. 9C and 11C). Then, the supply of the $N_2$ gas is stopped, and the wafer W is raised apart from the temperature control plate 3 by the elevating pins 42. Further, the processing vessel 5 is raised, and, thus, the processing space S is opened to an external atmosphere. Thereafter, the transfer arm A1 receives the wafer W (FIG. 10A) and transfers the wafer W to the cleaning module 7, and the wafer W is delivered by the elevating pins 81 to the spin chuck 71.

Figure 11D:
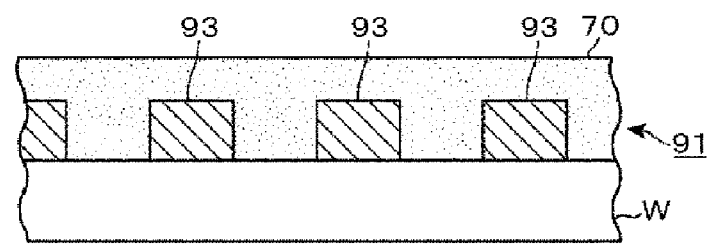
Figure 11E:
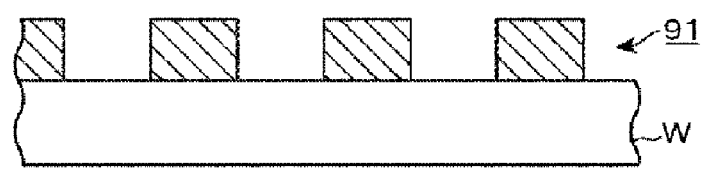

The spin chuck 71 rotates while holding the wafer W, and the cleaning solution supply nozzle 86 moves from the standby section 87 to above the center of the wafer W to supply a cleaning solution 70 to the center of the wafer W. The cleaning solution 70 is spread toward a periphery of the surface of the wafer W by a centrifugal force (FIG. 10B). As depicted in FIG. 11D, the exposed part 92 is cleaned with this cleaning solution 70 and removed from the surface of the wafer W, and a resist pattern is developed. After the supply of the cleaning solution is stopped, the cleaning solution is removed by rotation of the wafer W, and, thus, the wafer W is dried (FIG. 11E) and unloaded from the cleaning module 7 by the transfer arm A1.

This coating and developing apparatus 1 may include the developing module 2 for forming the developing solution film and performing a drying process on the wafer W; and the cleaning module 7 for cleaning the wafer W processed by the developing module 2. Therefore, the developing process by the developing module 2 and the cleaning process by the cleaning module 7 can be performed at the same time, and, thus, an increase in throughput can be achieved. Further, since the developing module 2 supplies mist of the developing solution, a moving mechanism of a nozzle for supplying the developing solution or a rotation mechanism for rotating the wafer W held thereon is not necessary. Therefore, the developing module 2 need not become large. Therefore, even if the module for supplying the developing solution and the module for supplying the cleaning solution are separated as described in this embodiment, the coating and developing apparatus 1 need not become large.

In a conventional coating and developing process using a developing module that performs a developing process by supplying a developing solution through a nozzle, after a PEB process, the wafer W may be transferred to the cooling module so as to be cooled to a predetermined temperature and then transferred to the developing module. Such a cooling process is performed to uniformize temperatures between the respective portions on the surface of the wafer W and between the wafers W and reduce a difference in line widths of the resist pattern. However, in this developing module 2, the temperature control plate 3 cools the wafer W in the same manner as the cooling module, and, thus, it is not necessary to transfer the wafer W that has been heated and roughly cooled by the heating module to the cooling module and cool the wafer W. After the PEB process, the wafer W may be transferred directly to the developing module 2 and a process may be performed on the wafer W by the developing module 2. Therefore, a further increase in throughput can be achieved. Further, by cooling the wafer W by the temperature control plate 3 as described above, volatilization of the developing solution during the developing process can be suppressed as compared to a case where the wafer W is temperature-controlled by being heated. Accordingly, a usage amount of the developing solution can be reduced.

Second Embodiment

Figure 12:
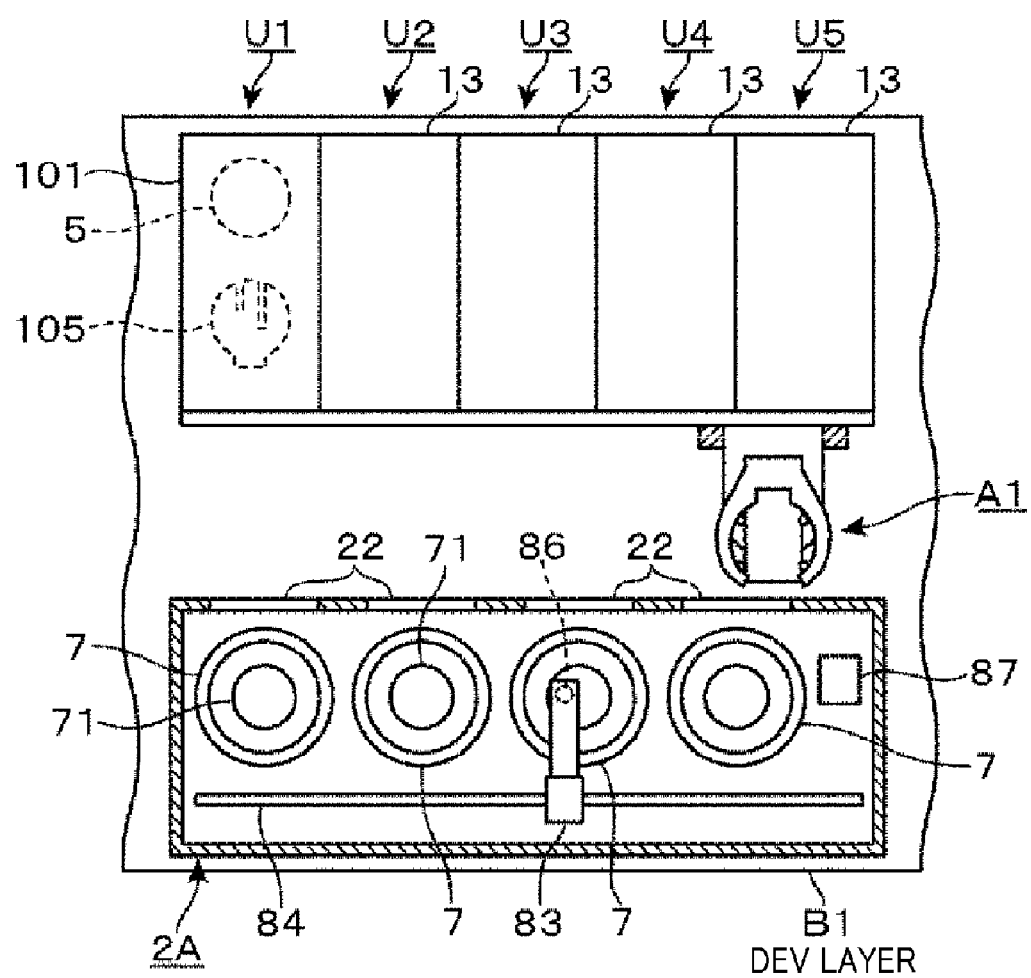
FIG. 12 is a plane view showing another configuration example of a first block of the coating and developing apparatus.

Hereinafter, there will be illustrated another configuration example of the first block (DEV layer) B1 in FIG. 12. In this embodiment, a module of the rack unit U1 may include a developing module 101. Further, a cleaning unit 2A corresponds to the developing unit 20. The cleaning unit 2A has the same configuration as the developing unit 20 except that four cleaning modules 7 are arranged in a horizontal direction and no developing module 2 is provided therein.

Figure 13:
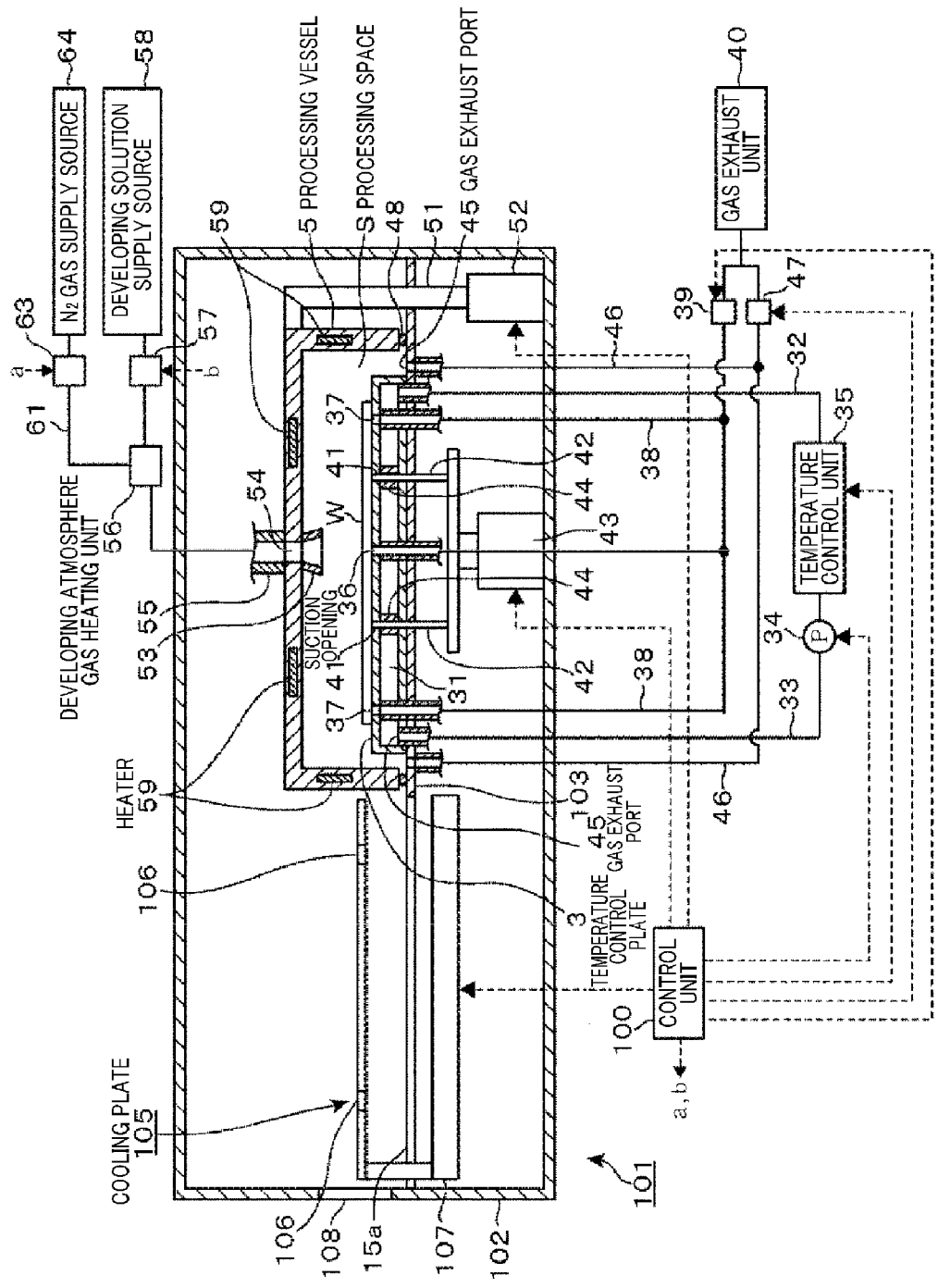
FIG. 13 is a longitudinal cross sectional view of a developing module having a different configuration.
Figure 14:
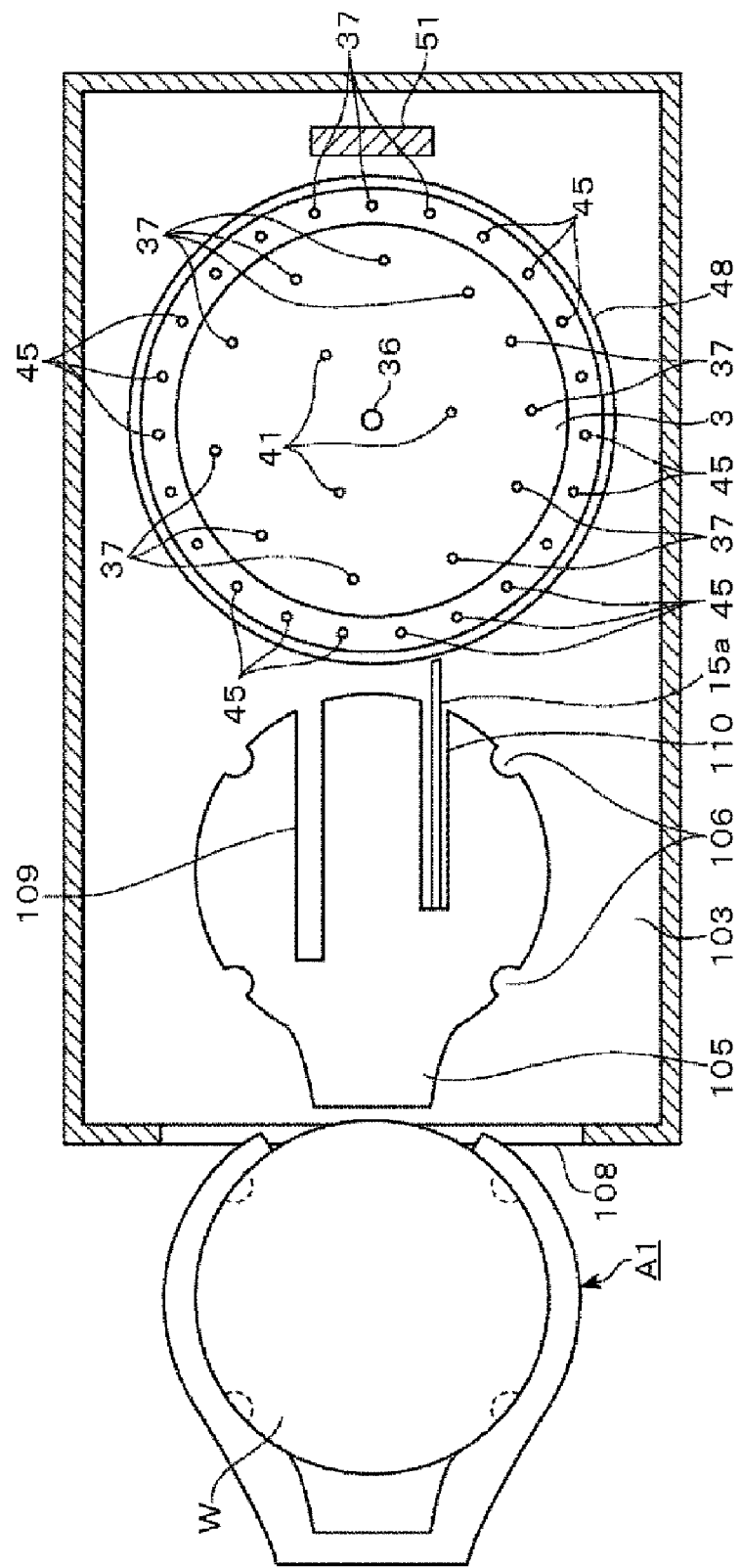
FIG. 14 is a transversal cross sectional view of the developing module.

There will be explained a difference between the developing module 101 and the developing module 2 with reference to FIGS. 13 and 14. FIGS. 13 and 14 are longitudinal cross sectional view and transversal cross sectional view of the developing module 101, respectively. In this developing module 101, the inside of a housing 102 is divided into an upper region and a lower region by a partition plate 103. Provided in the upper region above the partition plate 13 is a cooling plate 105. The cooling plate 105 is of a substantially circular shape and is provided with cut-off portions 106 so as not to interfere with a transfer arm A1 when the wafer W is transferred between the transfer arm A1 and the cooling plate 105. The cooling plate 105 has, in its rear surface, a non-illustrated flow path for flowing therein, e.g., temperature-controlled water. The wafer W, which is previously heated by a heating module 13, is mounted on the cooling plate 105, and the wafer W is cooled.

In a lower region below the partition plate 103, a driving unit 107 is provided. A reference numeral 108 denotes a transfer port for the wafer W, and the cooling plate 105 is moved between the transfer port 108 and the temperature control plate 3 by the driving unit 107 and transfers the wafer W. The cooling plate 105 is provided with slits 109 and 110, and elevating pins 42 are protruded from a surface of the cooling plate 105 through the slits 109 and 110.

In the second embodiment, the transfer arm A1 holding the wafer W is positioned above the cooling plate 105 and lowered, and then the wafer W is delivered to the cooling plate 105. Thereafter, the cooling plate 105 moves to above the temperature control plate 3 while cooling the wafer W to a preset temperature, and the wafer W is delivered to the elevating pins 42 in the same manner as in the first embodiment. Subsequently, the wafer W is developed in the same manner as in the first embodiment and then delivered from the elevating pins 42 to the cooling plate 105. Then, the transfer arm A1 receives the wafer W from the cooling plate 105 in the reverse order to the order in which the transfer arm A1 transfers the wafer W onto the cooling plate 105. Thereafter, the wafer W is transferred to the cleaning module 7 by the transfer arm A1 and cleaned. Even if the first block B1 is configured as the second embodiment, a process of supplying the developing solution and a cleaning process can be respectively performed by the developing module 101 and the cleaning module 7 at the same time. Therefore, a decrease in throughput can be suppressed in the same manner as in the first embodiment.

Third Embodiment

Figure 15:
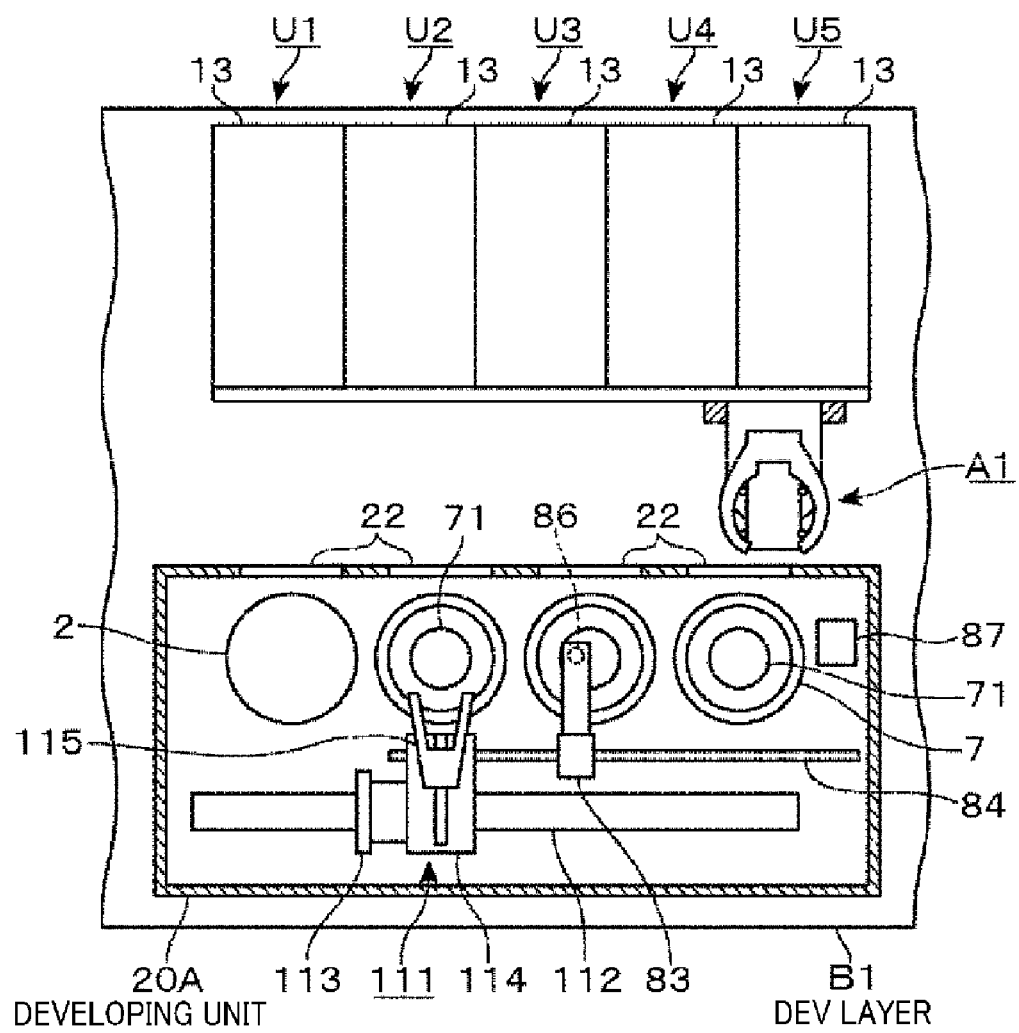
FIG. 15 is a plane view of still another configuration example of the first block of the coating and developing apparatus.
Figure 16:
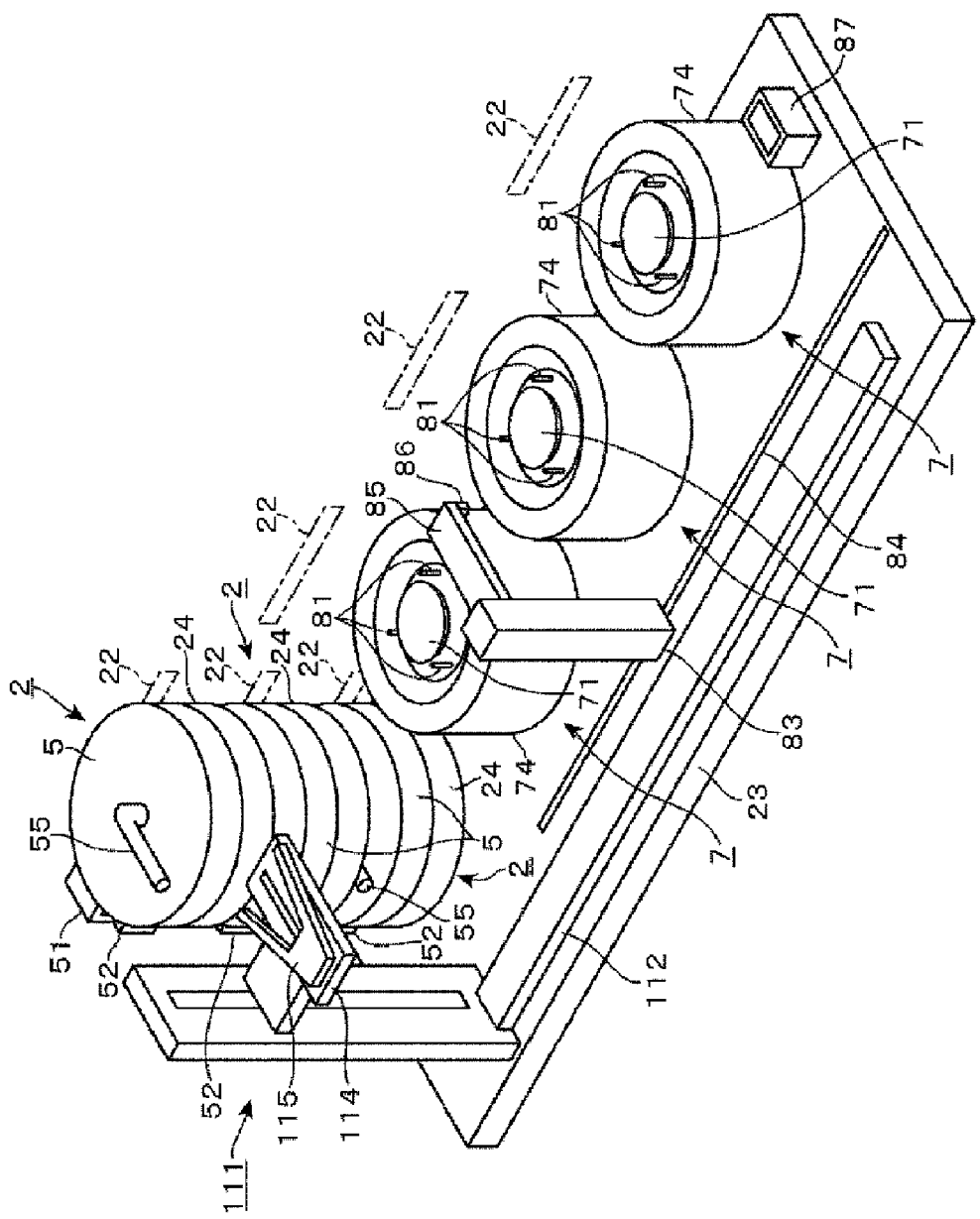
FIG. 16 is a perspective view of a developing unit included in the first block.

Hereinafter, there will be explained a difference between another configuration example of the first block B1 shown in FIG. 15 and the first embodiment. In the first block B1 shown in FIG. 15, a developing unit 20A is provided instead of the developing unit 20. The developing unit 20A is provided with a transfer mechanism 111 for transferring the wafer W from the developing module 2 to the cleaning module 7. FIG. 16 is a perspective view showing the inside of a housing 21 of the developing unit 20A. Provided on the base 23 is a guide 112 extended in an arrangement direction of the cleaning modules 7 and the developing module 2. A horizontally moving unit 113 constituting the transfer mechanism 111 horizontally moves along an extension direction of the guide 112. The horizontally moving unit 113 is connected with an elevating unit 114 configured to be vertically movable, and a transfer arm 115 is provided on the elevating unit 114. The transfer arm 115 is configured to be movable back and forth with respect to each module and the wafer W is delivered between the elevating pins 42 of the developing module 2 and the transfer arm 115 and between the elevating pins 81 of the cleaning module 7 and the transfer arm 115.

There will be explained a transfer route of the wafer W in the first block B1 including the developing unit 20A. The wafer W on which a PEB process has been performed by the heating module 13 is delivered to the developing module 2 by the transfer arm A1 and processed in the same manner as in the first embodiment and then transferred to the cleaning module 7 by the transfer arm 115. After a cleaning process, the wafer W is transferred to the heating module 13 by the transfer arm A1 and a POST process is performed on the wafer W. Even if the first block B1 is configured as described above, a process of supplying the developing solution and a cleaning process can be respectively performed by the developing module 101 and the cleaning module 7 at the same time. Therefore, a decrease in throughput can be suppressed in the same manner as in the first embodiment. Further, in accordance with the third embodiment, a transfer from the developing module to the cleaning module is performed by another transfer arm 115 not the transfer arm A1. Accordingly, a load of the transfer arm A1 is reduced and a decrease in throughput can be surely suppressed.

Modification Example of Third Embodiment

Figure 17A:
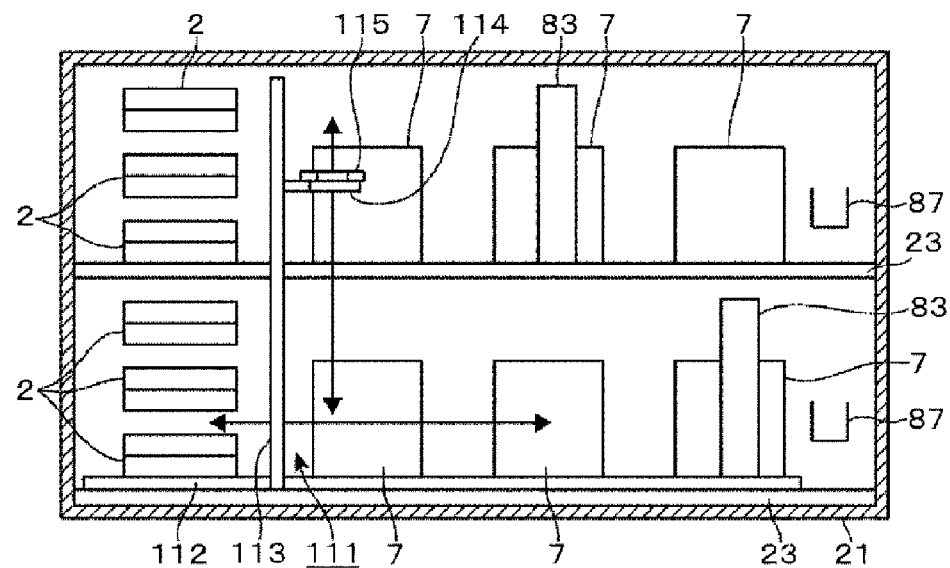
FIGS. 17A and 17B are a longitudinal cross sectional view and a transversal cross sectional view, respectively, of still another developing unit.
Figure 17B:
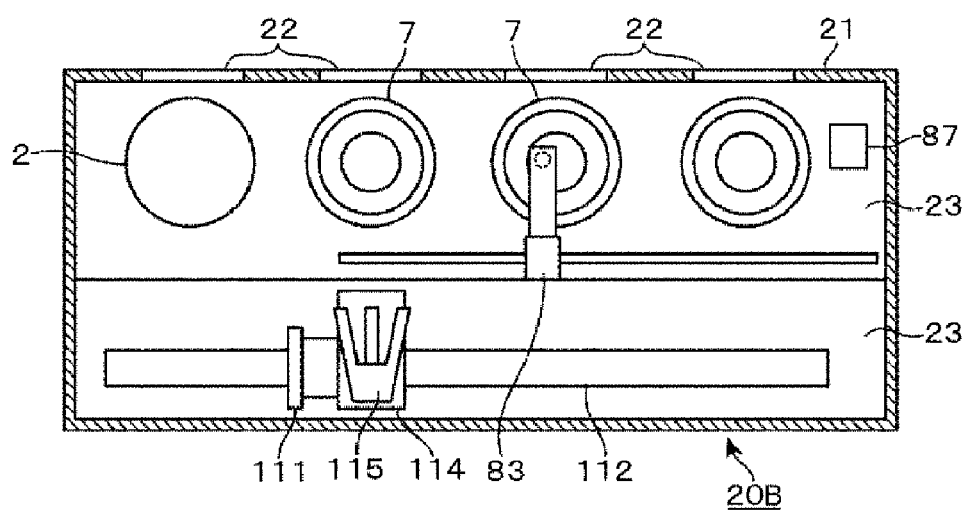

As described above, the developing units are stacked in two layers within the DEV layer B1. In the third embodiment, the transfer mechanism 111 is provided, for example, in each layer, but a single transfer mechanism may be commonly used in the layers to transfer the wafer W between a module in an upper layer and a module in a lower layer. FIGS. 17A and 17B are a front view and a plane view, respectively, of a developing unit 20B configured to transfer the wafer W as described above. An upper part and a lower part in the inside (opposite side of the transfer port 22) of the housing 21 communicate with each other. The horizontally moving unit 113 is extended from a lower layer toward an upper layer and the transfer arm 115 can access each of the developing modules 2 and the cleaning modules 7 in the upper layer and the lower layer.

Figure 18:
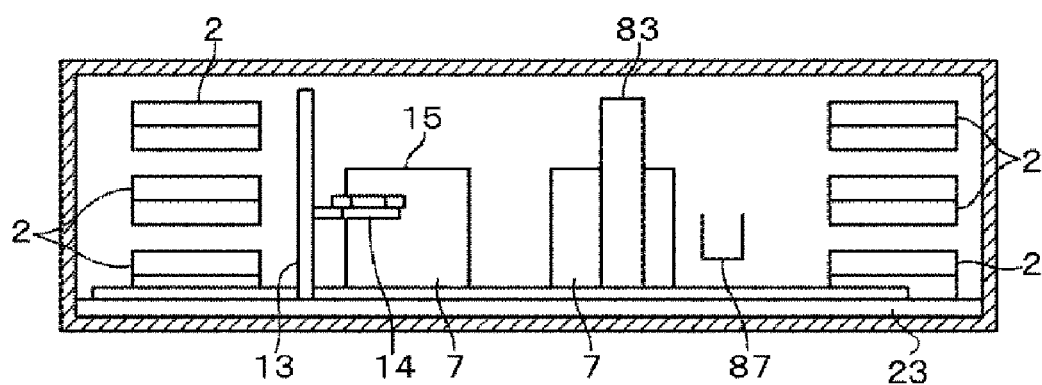
FIG. 18 is a longitudinal cross sectional view of still another developing unit.

Positions and the number of the developing modules 2 in the developing unit 20 and the developing unit 20A are not limited to the above-described embodiments, and, by way of example, the developing modules 2 may be arranged at both ends of the developing unit 20 or 20A in a longitudinal direction as depicted in FIG. 18.

In each embodiment described above, a maximum particle diameter of the developing mist is, for example, equal to or smaller than about 50 μm and an average particle diameter is, for example, equal to or smaller than 10 μm. By controlling a particle diameter as described above and supplying the developing mist in a dry fog, it is possible to prevent other areas than the wafer W from being wet with the developing solution during a developing process. Accordingly, defects in the developed pattern or generation of particles can be suppressed. Further, a method of forming the above-described developing atmosphere gas is not limited to heating the developing solution but ultrasonic waves may be applied to the developing solution.

A method of forming the developing solution film 50 is not limited to the above-described examples. By way of example, the developing atmosphere gas is heated to a temperature higher than a saturation temperature of the developing solution, for example, 50° C. by a heating atmosphere gas heating unit 56 and vapor of the developing solution (hereinafter, referred to as "developing vapor") is generated. The developing atmosphere gas of which temperature is controlled may be supplied into a processing space S and the wafer W may be cooled by the temperature control plate 3 and the developing vapor may be condensed on a surface of the wafer W. In this case, a process by a developing unit 121 will be explained.

Figure 19A:
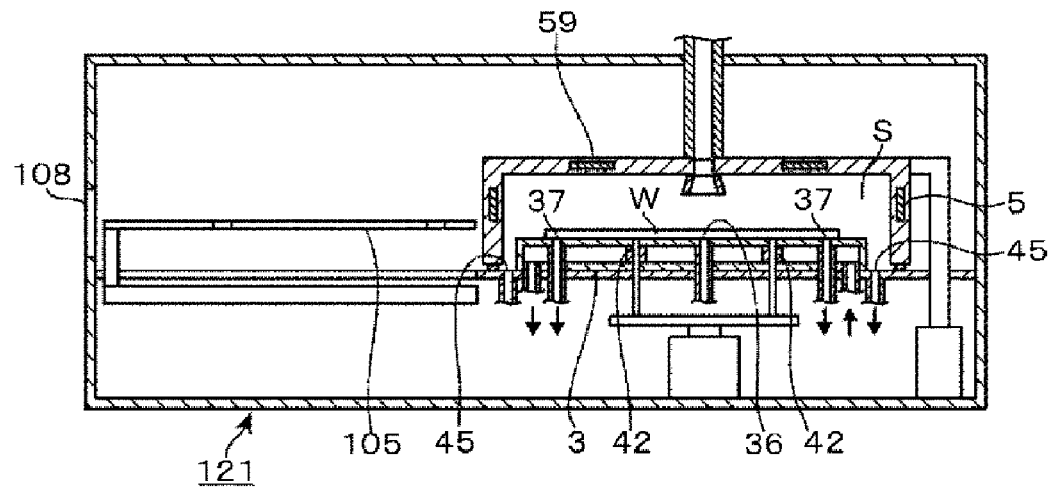
FIGS. 19A and 19B are process diagrams for illustrating a process sequence performed by the developing module.
Figure 19B:
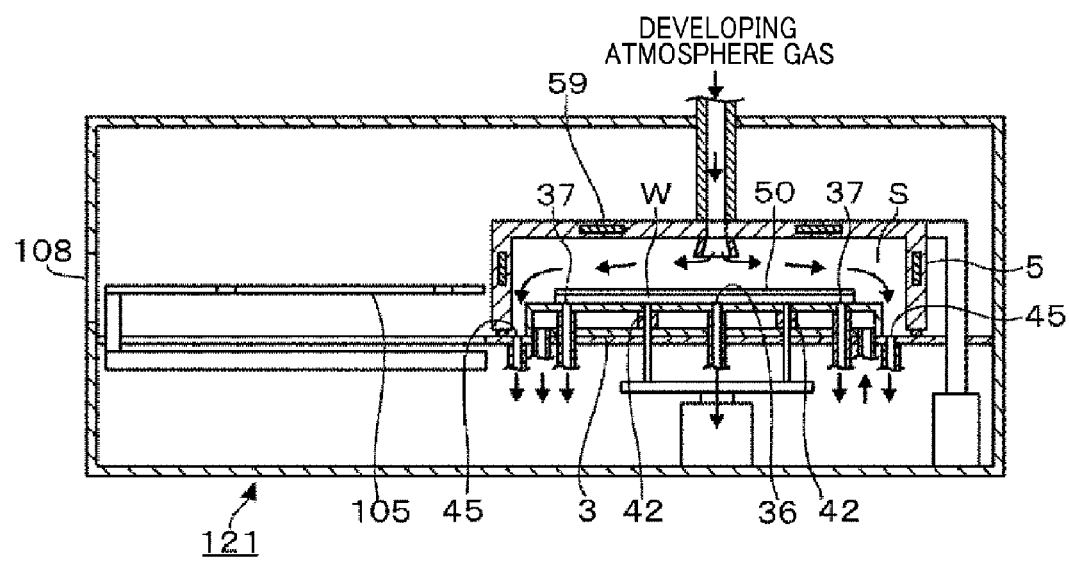

Above all, the heaters 59 maintain an inner wall of the processing vessel 5 at a temperature at which a developing atmosphere gas hardly condenses. Here, the temperature at which the developing atmosphere gas hardly condenses refers to a temperature at which the developing atmosphere gas does not condense and also refers to a temperature higher than a dew point of developing solution vapor included in the developing atmosphere gas supplied into the processing space S. Further, a wafer W is mounted on the temperature control plate 3 and is controlled to a temperature equal to or less than a dew point of developing vapor included in a developing atmosphere gas, and the processing space S is formed (FIG. 19A). The developing atmosphere gas is supplied into the processing space S, and the developing vapor is condensed on a surface of the wafer W (FIG. 19B). If a developing solution film 50 of a predetermined film thickness is formed, the supply of the developing vapor and evacuation through the gas exhaust ports 45 are stopped. Thereafter, as in the first embodiment, by supplying a $N_2$ gas, the developing atmosphere gas within the processing space S is removed and the wafer W is dried.

As stated above, even in case of supplying the developing atmosphere gas onto the wafer W, the same effects as obtained in the first embodiment can be still achieved. In case of supplying the developing atmosphere vapor, it may be also possible to hold the wafer W by the elevating pins apart from the temperature control plate 3 when the processing space S is formed, and it may be possible to mount the wafer W on the temperature control plate 3 after the developing atmosphere gas is supplied into the processing space S and then form the developing solution film 50. The developing solution which has been condensed on the temperature control plate 3 during the process is suctioned by the suction openings 36 and 37. Further, the developing atmosphere gas may include both the developing mist and the developing vapor, and in this case, the developing solution film 50 is formed by an adhesion amount of the developing mist and a condensation amount of the developing solution vapor.

Further, even if the developing solution film 50 is formed by condensing the developing solution, the wafer W may be dried by using the drying method of the other embodiments, for example, by opening the processing space S. Otherwise, it may be also possible to raise the wafer W apart from the temperature control plate 3 by, e.g., the elevating pins 42 and to dry the wafer W by heat of the developing vapor remaining in the processing space S. Timing for beginning each drying process is, for example, a time when a reaction between the developing solution and the resist is stopped, i.e., when an unnecessary resist can be removed if a cleaning process is performed.

Furthermore, in each embodiment, the inner wall of the processing vessel 5 may be heated by independently supplying, for example, a $N_2$ gas heated by the developing atmosphere gas heating unit 56 into the processing space S instead of using the heaters 59 of the processing vessel 5. Accordingly, a temperature of the inner wall may be controlled to be higher than a condensation temperature of the developing vapor, and the developing atmosphere gas may be supplied thereafter in order to suppress condensation of the developing vapor of the developing atmosphere gas onto the inner wall.

Moreover, a method of drying the wafer W is not limited to the above-described method of supplying the $N_2$ gas. By way of example, in the above-described process, after the developing solution film 50 is formed on the wafer W and after the lapse of the preset time after the wafer W is mounted on the temperature control plate 3, the processing vessel 5 is raised while the wafer W remains on the temperature control plate 3 and the processing space S may be opened to the external atmosphere. If the processing space S is opened, an atmosphere outside the processing vessel 5 flows around the wafer W, a partial pressure of developing vapor around the wafer W is decreased and a vapor pressure of the developing solution film 50 is decreased. Consequently, the liquid component forming the developing solution film 50 evaporates and the surface of the wafer W becomes dry. Further, a dry condition of the wafer W means a condition where the liquid component forming the developing solution is removed and other components forming the developing solution may adhere to the wafer W. In evaluation tests to be described later, it has been confirmed that if the liquid is removed, the reaction between the developing solution and the resist is stopped.

(Evaluation Tests)

(Evaluation Test 1)

A developing solution was supplied through a nozzle onto wafers W1 to W3 on which resist is coated and which is exposed to light via a preset pattern. For the wafer W1, an image of a cross section of the resist was captured after the developing solution is supplied. For the wafer W2, an image of a cross section of the resist was captured after the developing solution was supplied and then a cleaning solution was supplied for about 2 seconds. For the wafer W3, an image of a cross section of the resist was captured after the developing solution was supplied and then the cleaning solution was supplied for about 13 seconds. Further, the same experiment was conducted while varying the kind of the resist coated on the wafers W1 to W3.

Figure 20A:
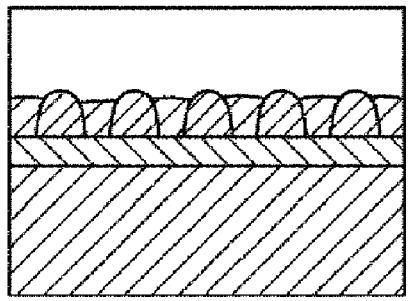
FIGS. 20A to 20F are longitudinal cross sectional views of wafers obtained in an evaluation test.
Figure 20B:
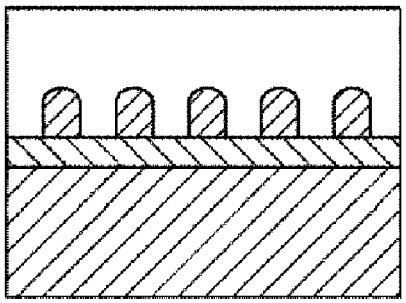
Figure 20C:
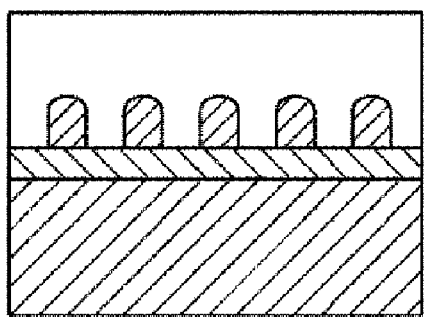
Figure 20D:
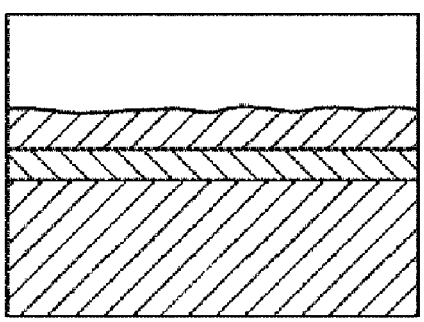
Figure 20E:
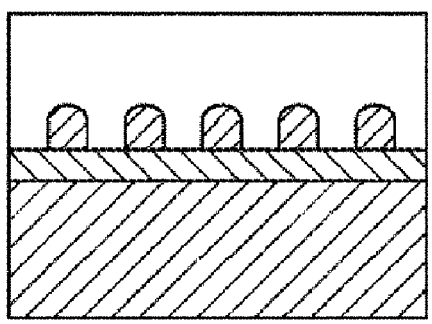
Figure 20F:
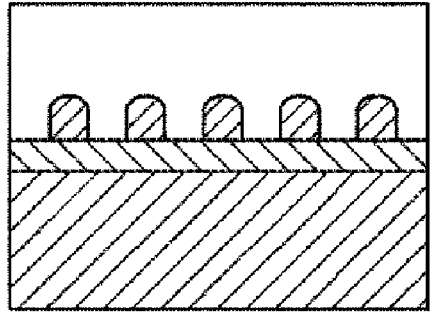

FIGS. 20A to 21F provide results of the evaluation test 1. FIGS. 20A to 20C show images of the wafers W1 to W3 using the same kind of resist, and FIG. 20D to 20F show images of the wafers W1 to W3 using another same kind of resist. Regardless of the kinds of the resist, patterns were not developed on the wafer W1 on which the cleaning solution was not supplied, whereas patterns were developed on the wafers W2 and W3 on which the cleaning solution was supplied. As can be seen from the result of this experiment, the exposed resist starts to be dissolved in the step that the cleaning solution is supplied, not in the step that the developing solution is supplied. That is, the result shows that it is not by the developing solution that dissolved resist residues are removed. Accordingly, when a developing process is performed, it is deemed to be enough to supply a small amount of developing solution onto the resist. Through this experiment, the present inventors have reached the idea of forming the thin film of the developing solution by supplying the developing mist onto the surface of the wafer W.

(Evaluation Test 2)

Exposed wafers W1 and W2 were prepared as in the evaluation test 1. The wafer W1 was mounted on a spin chuck, and a developing solution was supplied through a nozzle while rotating the wafer W1 about a vertical axis by the spin chuck. While supplying the developing solution, a supply position of the developing solution was moved from a periphery of the wafer W1 toward a center thereof in a diametric direction, and, then, the developing solution toward the center of the wafer W1 was continuously supplied for a preset time. After the completion of the supply of the developing solution, the developing solution was removed by supplying a cleaning solution onto the wafer W1. Then, an image of a cross section of resist was captured.

Further, the wafer W2 was transferred into a processing vessel including a vessel main body and a top lid. After an airtightly sealed processing space is formed within the processing vessel by closing the top lid, a processing atmosphere was created by supplying developing mist into the processing space while evacuating the processing space, as in the first embodiment. After the supply of the developing mist, the developing solution was removed by supplying the cleaning solution onto the wafer W2, and an image of a cross section of resist was captured.

Figure 21A:
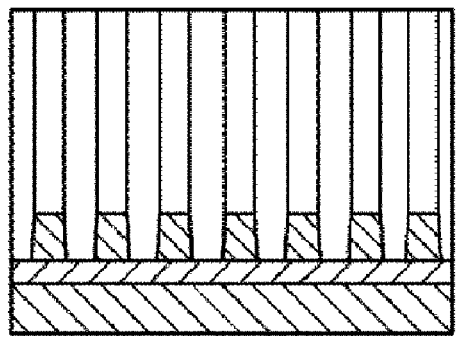
FIGS. 21A to 21D are longitudinal cross sectional views of wafers obtained in an evaluation test.
Figure 21B:
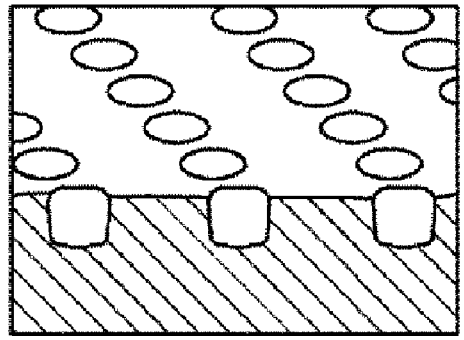
Figure 21C:
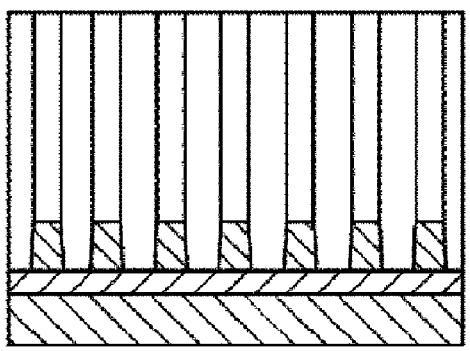
Figure 21D:
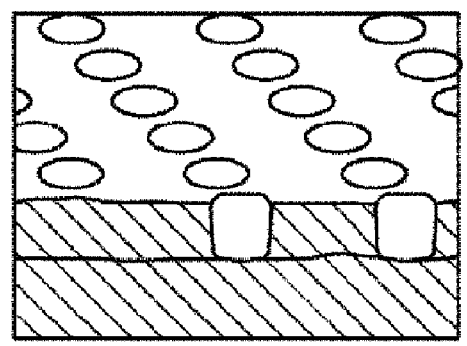

FIGS. 21A and 21B show images of the wafer W1, and FIGS. 21C and 21D show images of the wafer W2. As can be seen from the figures, there is almost no difference between pattern shapes formed on the wafers W1 and W2. From this experiment, it is proved that a developing process can be performed by using the mist of the developing solution in the same way as in the case of supplying the developing solution through the nozzle.

(Evaluation Test 3)

A plurality of exposed wafers W was prepared as in the evaluation tests 1 and 2. The wafers W were sequentially transferred into a processing vessel including a vessel main body and a top lid. After an airtightly sealed processing space is formed by closing the top lid, a processing atmosphere was created by supplying developing mist into the processing space while evacuating the processing space. The supply time of the developing mist was varied from about 45 seconds to about 60 seconds and to about 90 seconds for each wafer W. After the developing mist was supplied, the processing space was opened to an external atmosphere by opening the top lid and the wafer W was taken out and a cleaning process was performed on the wafer W. A CD average of a resist pattern at each portion on the surface of each wafer W was calculated and 3 σ as an index of non-uniformity was also calculated for CD. Experiments in which the supply time of the developing mist was set to be 45 seconds, 60 second and 90 seconds will be referred to as evaluation tests 3-1, 3-2 and 3-3, respectively.

(Evaluation Test 4)

As in the evaluation test 3, a CD average and 3 σ were calculated for wafers W on which a cleaning process was performed after a developing solution was supplied through a nozzle as in the evaluation test 2. The supply time of the developing solution through the nozzle was varied for each wafer W. Experiments with different supply times will be referred to as evaluation test 4-1, 4-2 and 4-3 in the order in which the supply time is shortest.

(Evaluation Test 5)

Figure 22:
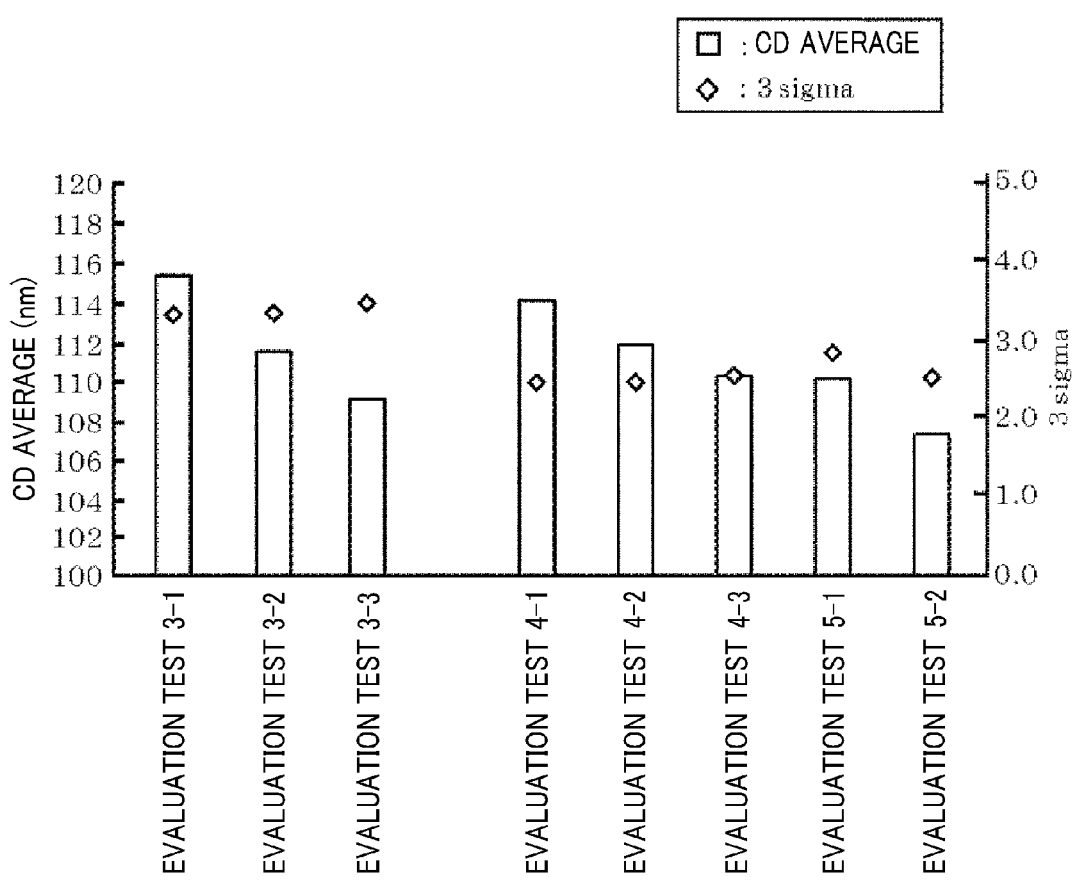
FIG. 22 is a graph showing CD averages and 3 σ values of patterns obtained in an evaluation test.

A developing solution was discharged onto wafers W through a nozzle having a discharge opening elongated in a diametric direction of the wafer W while moving the nozzle from one end of the wafer W to the other end thereof. After liquid is accumulated on the wafers W, a cleaning process was performed. The supply time of the developing solution was varied for each wafer W. Experiments in which the supply time of the developing solution was set to be about seconds and about 60 seconds will be referred to as evaluation test 5-1 and 5-2, respectively FIG. 22 shows results of the evaluation tests 3 to 5. In FIG. 22, bar graphs indicate CD averages in the respective evaluation tests, and dots indicate 3 σ values in the respective evaluation tests. From these results, it is found out that the CD average decreases with the rise of the supply time of the developing solution when the mist of the developing solution is supplied, as in the case of supplying the developing solution through the nozzle. Further, as for the 3 σ values, there is found no great difference between the two cases when the mist of the developing solution is supplied and when the developing solution is supplied through the nozzle. From the results of the evaluation tests, it is proved that a developing process using the developing mist does not have a great influence on a pattern shape as compared to a developing process performed by supplying the developing solution through the nozzle.

(Evaluation Test 6)

As in the evaluation test 3, developing mist was supplied into a processing space in which an exposed wafer W is loaded while evacuating the processing space. The supply time of the developing mist was set to about 30 seconds. After the supply of the developing mist was stopped, a surface of the wafer W was dried by opening the processing space to an external atmosphere, and a cleaning process was performed on the wafer W afterward. Then, as in the evaluation test 3, a CD average of a resist pattern and 3 σ of CD values were calculated for each wafer W. A time period from the stoppage of the supply of the developing mist till the opening of the processing space was set to be about 30 seconds and about 180 seconds for each wafer W. Experiments in which the time period till the opening of the processing space was set to about 30 seconds and about 180 seconds will be referred to as evaluation tests 6-1 and 6-2, respectively.

Further, the same experiments as the evaluation tests 6-1 and 6-2 were performed by setting the supply time of the developing mist to about 60 seconds. A time period from the stoppage of the supply of the developing mist till the opening of the processing space was set to be about 0 second, about 30 seconds and about 180 seconds for each wafer W. Experiments in which the time period till the opening of the processing space was set to 0 second, about 30 seconds and about 180 seconds will be referred to as evaluation tests 6-3, 6-4 and 6-5, respectively.

Figure 23:
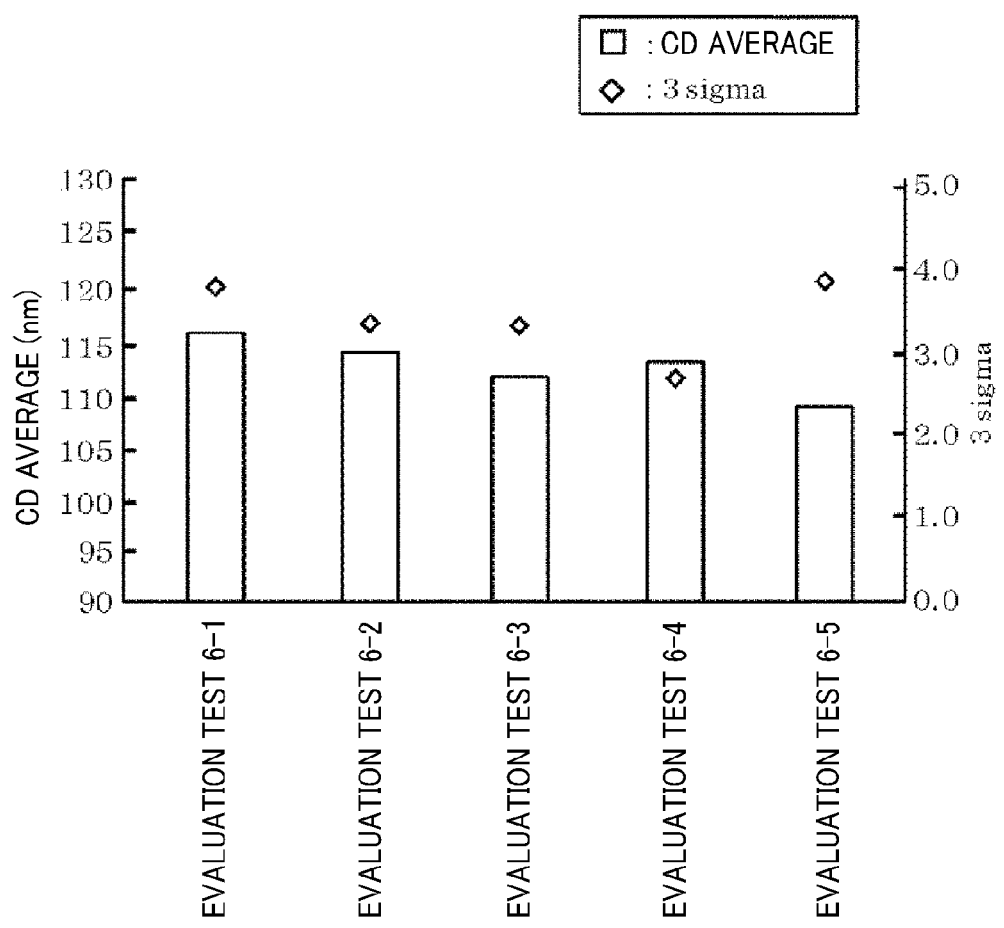
FIG. 23 is a graph showing CD averages and 3 σ values of patterns obtained in an evaluation test.

FIG. 23 shows a result of the evaluation test 6. In FIG. 23, bar graphs indicate CD averages and dots indicate 3 σ values. In the evaluation test 6-5, a 3 σ value is found to be slightly greater than 3 σ values in the evaluation tests 6-1 to 6-4, which indicates that CD non-uniformity of the resist pattern is slightly higher in the evaluation test 6-5. Furthermore, the CD averages are found to decrease with the rise of the time period till the opening of the processing space. It is deemed to be because surfaces of the wafers W were not dried due to the developing mist remaining in the processing space and the developing process further progressed even after the supply of the developing mist was stopped. From the result of the evaluation test 6, it is found out that a pattern shape is affected by a time period taken until a surface of a wafer W is dried.

(Evaluation Test 7)

As in the evaluation test 3, developing mist was supplied into a processing space in which an exposed wafer W is loaded while evacuating the processing space. The supply time of the developing mist was set to about 60 seconds. After the supply of the developing mist was stopped, a surface of the wafer W was dried by opening the processing space to an external atmosphere, and a cleaning process was performed on the wafer W afterward. A time period from opening of the processing space till the cleaning process was performed was set to be about 10 seconds, about 45 seconds, about 90 seconds, about 180 seconds and about 600 seconds for each wafer W. Then, as in the evaluation test 3, a CD average of a resist pattern and 3 σ of CD values were calculated for each wafer W. Experiments in which the time period till the cleaning process was performed was set to about 10 seconds, about 45 seconds, about 90 seconds, about 180 seconds and about 600 seconds will be referred to as evaluation tests 7-1, 7-2, 7-3, 7-4 and 7-5, respectively.

Figure 24:
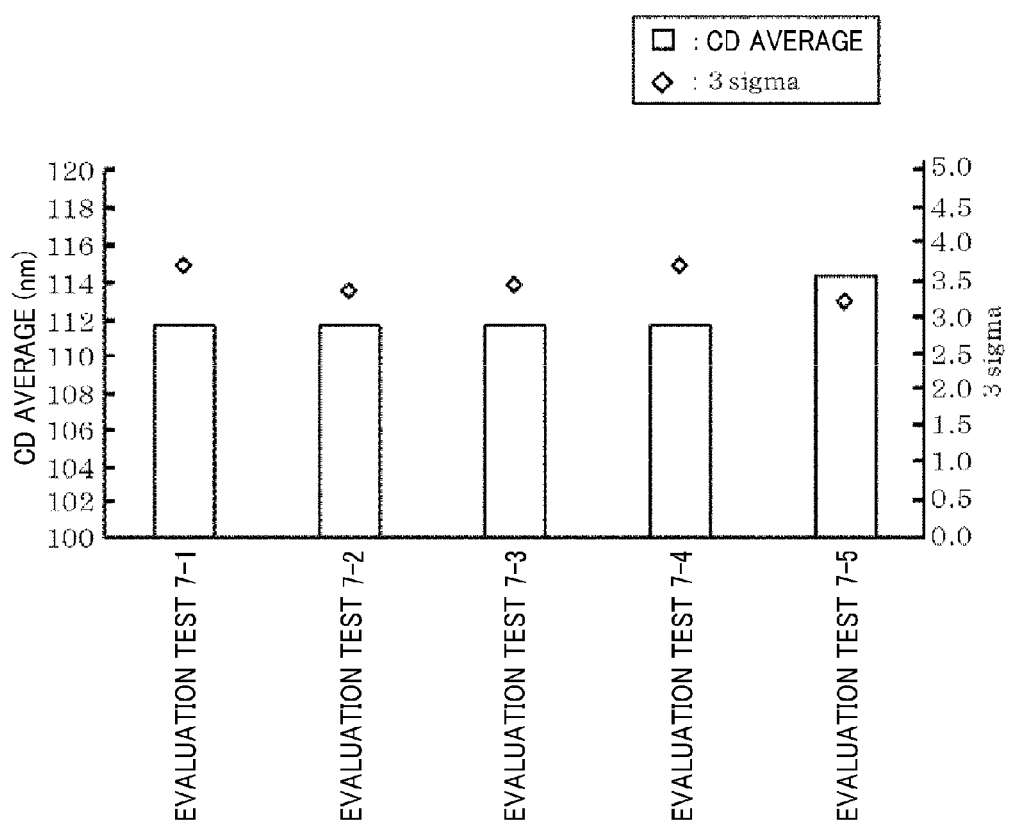
FIG. 24 is a graph showing CD averages and 3 σ values of patterns obtained in an evaluation test.

FIG. 24 shows a result of the evaluation test 7. In FIG. 24, bar graphs indicate CD averages and dots indicate 3 σ values. The CD average and the 3 σ value are found to be not greatly varied between the experiments, which indicates that a time period taken until a cleaning process is performed after a wafer W is dried does not have a great influence on a pattern shape. Accordingly, as can be seen from this result, after a surface of the wafer W is dried, the wafer W is transferred into to a cleaning module and the cleaning process can be performed on the wafer W, as in the above-described embodiments.

What is claimed is:

1. A coating and developing apparatus that develops a substrate of which surface is coated with resist and exposed to lights, the apparatus comprising:
    at least one developing module;
    a cleaning module; and
    a transfer mechanism configured to transfer a substrate developed by the developing module to the cleaning module,
    wherein the developing module includes:
        an airtightly sealed processing vessel configured to form a processing atmosphere therein;
        a temperature control plate that is provided in the processing vessel and mounts thereon the substrate and cools the substrate; and
        an atmosphere gas supply unit configured to supply an atmosphere gas including mist of a developing solution to a surface of the substrate within the processing vessel, and
    wherein the cleaning module includes:
        a mounting table configured to mount thereon the substrate; and
        a cleaning solution supply unit configured to supply a cleaning solution to the substrate mounted on the mounting table.

2. The coating and developing apparatus of claim 1, further comprising:
    a heating module configured to heat the exposed substrate before a developing process; and
    a main transfer mechanism configured to deliver the substrate which has been heated by the heating module to the developing module,
    wherein the transfer mechanism configured to transfer the substrate from the developing module to the cleaning module is provided separately from the main transfer mechanism and accommodated in a common housing together with the developing module and the cleaning module to serve as a developing unit.

3. The coating and developing apparatus of claim 1, wherein the at least one developing module is plural in number and the developing modules are stacked in multi layers.

4. The coating and developing apparatus of claim 1,
    wherein the atmosphere gas supply unit supplies an atmosphere gas including vapor of the developing solution into the processing vessel in order to form a liquid film by condensing the developing solution on a surface of the substrate instead of supplying the atmosphere gas including the mist of the developing solution in order to form a liquid film of the developing solution on the surface of the substrate, and
    the temperate control plate controls a temperature of the substrate so as to condense the vapor onto the surface of the substrate.

5. The coating and developing apparatus of claim 1, wherein the atmosphere gas supply unit includes a heating unit configured to heat the atmosphere gas.

6. The coating and developing apparatus of claim 5, wherein the atmosphere gas is heated to a temperature higher than a saturation temperature of the developing solution in a heating atmosphere.

7. A developing method for developing a substrate of which surface is coated with resist and exposed to light, the method comprising:

loading the substrate into an airtightly sealed processing vessel configured to form a processing atmosphere therein;

mounting the substrate on a temperature control plate provided in the processing vessel;

cooling the substrate by the temperature control plate;

supplying an atmosphere gas including mist of a developing solution onto the surface of the substrate loaded into the processing vessel; and unloading the substrate from the processing vessel, loading the substrate into a cleaning module, and cleaning the substrate with a cleaning solution.

8. The developing method of claim 7, further comprising:

supplying an atmosphere gas including vapor of the developing solution onto the surface of the substrate instead of supplying the atmosphere gas including the mist of the developing solution thereto; and controlling a temperature of the substrate by the temperature control plate to condense the vapor is condensed onto the surface of the substrate.

9. The developing method of claim 7, further comprising:

heating the atmosphere gas by a heating unit.

10. The developing method of claim 9, wherein the atmosphere gas is heated to a temperature higher than a saturation temperature of the developing solution in a heating atmosphere.

11. A non-transitory medium that stores therein a computer program to be used in a coating and developing apparatus, wherein the computer program includes processing steps for implementing a developing method as claimed in claim 7.

\* \* \* \* \*

UNITED STATES PATENT AND TRADEMARK OFFICE
CERTIFICATE OF CORRECTION

| | |
|---|---|
| PATENT NO. | : 8,262,300 B2 |
| APPLICATION NO. | : 13/025300 |
| DATED | : September 11, 2012 |
| INVENTOR(S) | : Yasushi Takiguchi et al. |

It is certified that error appears in the above-identified patent and that said Letters Patent is hereby corrected as shown below:

In the Specifications:

In column 14, line 22, insert --42-- between "pins" and "apart"

Signed and Sealed this
Fourth Day of June, 2013

Teresa Stanek Rea
*Acting Director of the United States Patent and Trademark Office*